(12) United States Patent
Ku et al.

(10) Patent No.: US 11,277,929 B2
(45) Date of Patent: Mar. 15, 2022

(54) PERSONAL COMPUTING DEVICE COVERS HAVING STANDS

(71) Applicant: Intel Corporation, Santa Clara, CA (US)

(72) Inventors: Jeff Ku, Taipei (TW); Juha Paavola, Hillsboro, OR (US); Mark Carbone, Cupertino, CA (US); Shantanu Kulkarni, Hillsboro, OR (US); Mikko Makinen, Santa Clara, CA (US); Gustavo Fricke, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/716,867

(22) Filed: Dec. 17, 2019

(65) Prior Publication Data

US 2020/0128687 A1 Apr. 23, 2020

Related U.S. Application Data

(60) Provisional application No. 62/937,631, filed on Nov. 19, 2019.

(51) Int. Cl.
*H05K 5/00* (2006.01)
*H05K 5/03* (2006.01)
(Continued)

(52) U.S. Cl.
CPC .............. *H05K 5/03* (2013.01); *G06F 1/1618* (2013.01); *G06F 1/1656* (2013.01);
(Continued)

(58) Field of Classification Search
None
See application file for complete search history.

(56) References Cited

U.S. PATENT DOCUMENTS 8,424,829 B2 * 4/2013 Lu .......................... A45C 11/00
248/371
8,714,351 B2 * 5/2014 Toulotte ................. F16M 11/10
206/320

(Continued)

FOREIGN PATENT DOCUMENTS

JP        D1528851        7/2015
KR     300808191.0000    7/2015
(Continued)

OTHER PUBLICATIONS

Lenovo, The Think Pad X1Fold from Lenovo, last retrieved on Jul. 9, 2020, 1 page.
(Continued)

*Primary Examiner* — Anthony Q Edwards
*Assistant Examiner* — Rashen E Morrison
(74) *Attorney, Agent, or Firm* — Hanley, Flight & Zimmerman, LLC

(57) ABSTRACT

Personal computing device covers having stands are disclosed. A disclosed example apparatus includes a protective cover to at least partially cover a personal computing device. The cover includes a fixed panel to be thermally coupled to a chassis of the personal computing device to define a heatsink of the personal computing device, and a foldable panel to be rotatably coupled to the fixed panel via a hinge to support the personal computing device to stand at an angle from a surface.

27 Claims, 22 Drawing Sheets

(51) Int. Cl.
*H05K 5/02* (2006.01)
*G06F 1/16* (2006.01)
*H05K 7/20* (2006.01)

(52) U.S. Cl.
CPC .......... *G06F 1/1669* (2013.01); *G06F 1/1681* (2013.01); *H05K 5/0226* (2013.01); *H05K 5/0234* (2013.01); *H05K 5/0239* (2013.01); *H05K 7/20163* (2013.01)

(56) References Cited

U.S. PATENT DOCUMENTS

| | | | |
|---|---|---|---|
| D744,493 S | 12/2015 | Kim et al. | |
| 9,225,377 B1* | 12/2015 | Hart | H04B 1/3888 |
| D790,531 S | 6/2017 | Magi | |
| D796,515 S | 9/2017 | Kim et al. | |
| D814,455 S | 4/2018 | Kwon | |
| 9,947,883 B2 | 4/2018 | Choi et al. | |
| D825,513 S | 8/2018 | Seo et al. | |
| D826,203 S | 8/2018 | Seo et al. | |
| D826,889 S | 8/2018 | Seo et al. | |
| D827,604 S | 9/2018 | Seo et al. | |
| D828,318 S | 9/2018 | Seo et al. | |
| D828,319 S | 9/2018 | Seo et al. | |
| D901,426 S | 11/2020 | Lee et al. | |
| 10,838,467 B1 | 11/2020 | Mehandjiysky et al. | |
| D910,009 S | 2/2021 | Wu et al. | |
| D912,662 S | 3/2021 | Kurma Raju et al. | |
| D915,335 S | 4/2021 | Lee et al. | |
| D915,336 S | 4/2021 | Lee et al. | |
| D915,337 S | 4/2021 | Lee et al. | |
| 2004/0005184 A1* | 1/2004 | Kim | G06F 1/1618 400/472 |
| 2004/0118579 A1* | 6/2004 | McCutcheon | H01L 23/3735 174/16.3 |
| 2011/0147398 A1* | 6/2011 | Ahee | G06F 1/1662 220/810 |
| 2011/0284420 A1* | 11/2011 | Sajid | G06F 3/0202 206/576 |
| 2011/0294420 A1* | 12/2011 | Hebiguchi | H04B 13/005 455/41.1 |
| 2012/0211631 A1* | 8/2012 | Lu | F16M 13/00 248/371 |
| 2013/0114098 A1* | 5/2013 | LeGrande | G06K 15/00 358/1.13 |
| 2013/0258586 A1* | 10/2013 | Shao | A45C 11/00 361/679.55 |
| 2014/0182926 A1* | 7/2014 | Iwamoto | G06F 1/1626 174/535 |
| 2016/0049981 A1* | 2/2016 | Jen | H04B 1/3877 455/575.8 |
| 2018/0210514 A1* | 7/2018 | Wang | G06F 1/1681 |
| 2018/0284856 A1* | 10/2018 | Shah | G06F 1/1637 |
| 2019/0196541 A1 | 6/2019 | O'Neil et al. | |
| 2019/0346893 A1* | 11/2019 | Dillow | G06F 1/1656 |
| 2020/0128687 A1 | 4/2020 | Ku et al. | |
| 2021/0034110 A1 | 2/2021 | Hamburgen et al. | |
| 2021/0141422 A1 | 5/2021 | Seo et al. | |
| 2021/0149514 A1 | 5/2021 | Ko et al. | |

FOREIGN PATENT DOCUMENTS

| | | |
|---|---|---|
| KR | 300750697.0000 | 7/2017 |
| KR | 300838109.000 | 2/2019 |

OTHER PUBLICATIONS

Galaxy Fold, Samsung, 9news.com.au, published by Matthew Dunn on Nov. 15, 2019 © 2021 Nine Digital Pty Ltd, online, site visited May 25, 2021. Available URL: https://www.9news.eom.au/technology/samsung-galaxy-fold-review-australia-price-release-date-specs-news-u pdate/7bbc03cd-b577-4e8f-8cf9-98 92 (Year 2019).

Horsehoe Bend PC, Intel, xda-developers.com, published by Tushar Mehta on Jan. 7, 2020 © xda-developers, online, site visited May 25, 2021, Available from Internet, URL: https://www.xda-developers.com/intel-tiger-lake-horseshoe-bend-foldable-pc-laptop/ (Year: 2020).

* cited by examiner

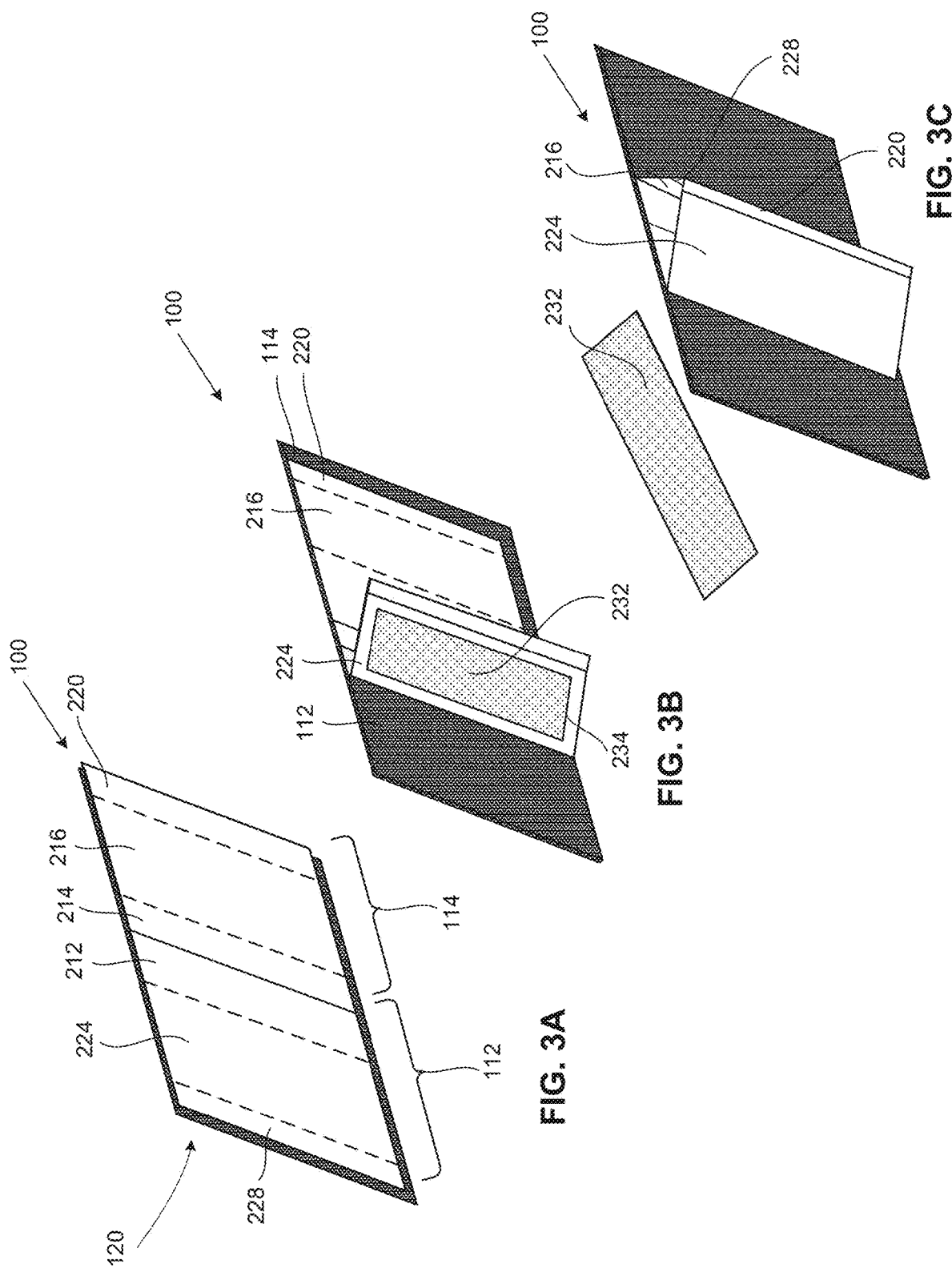

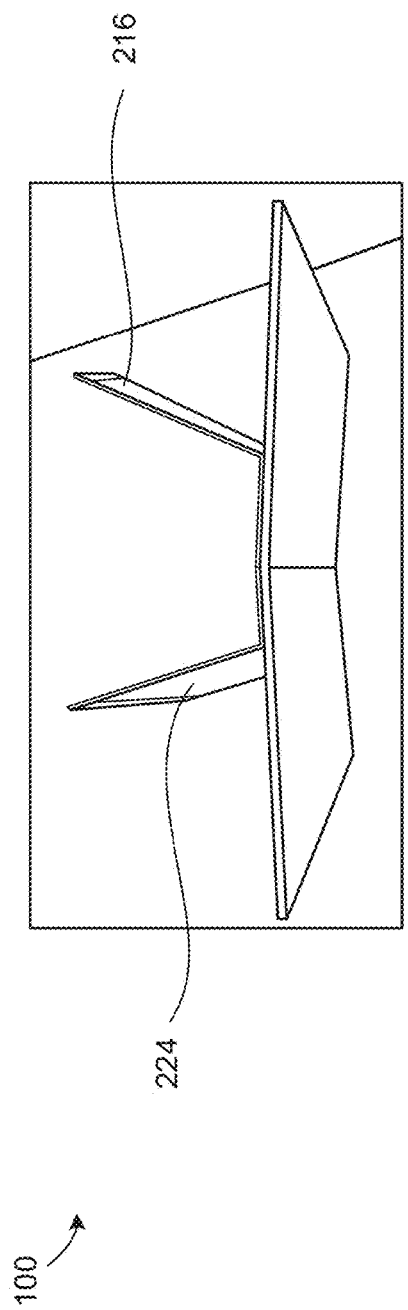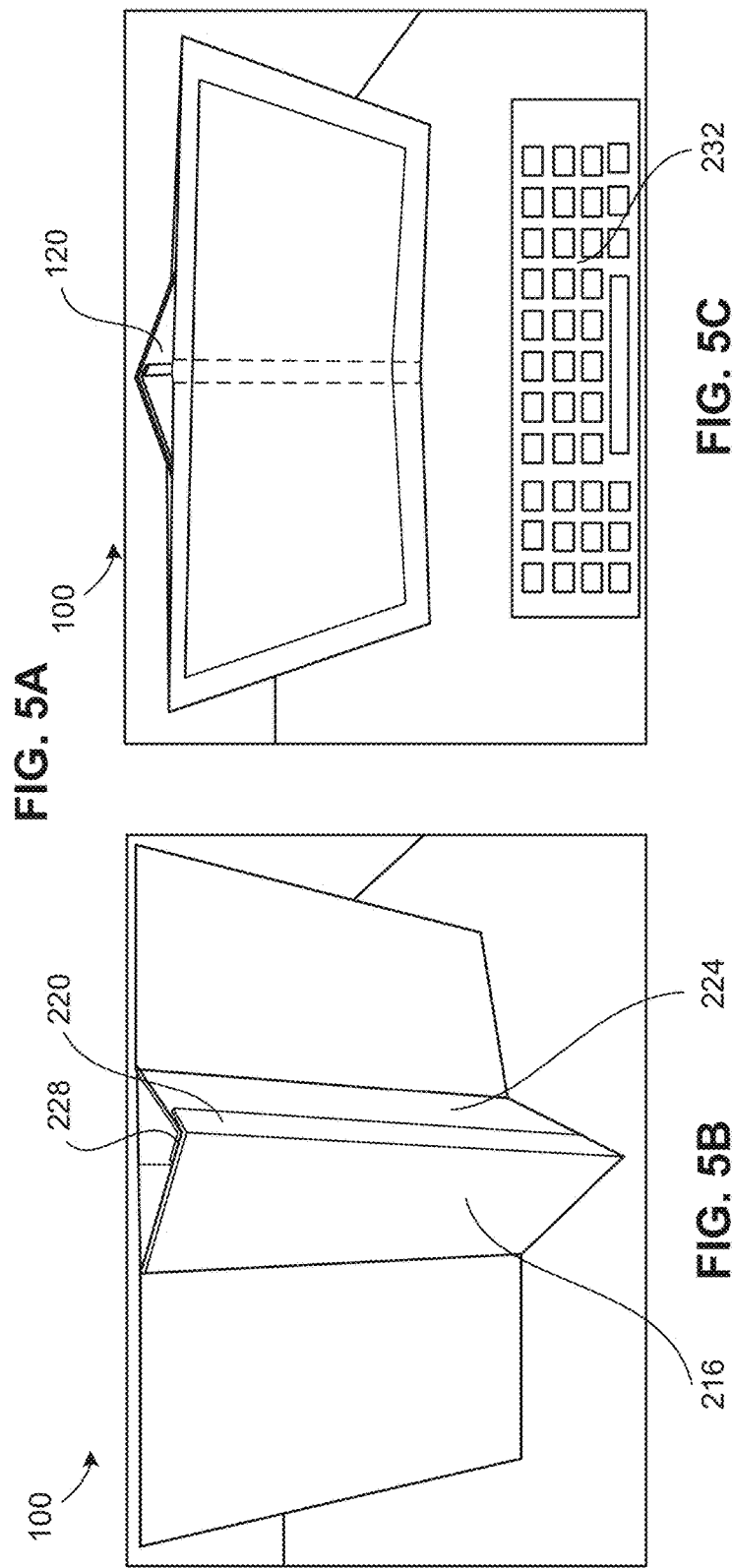

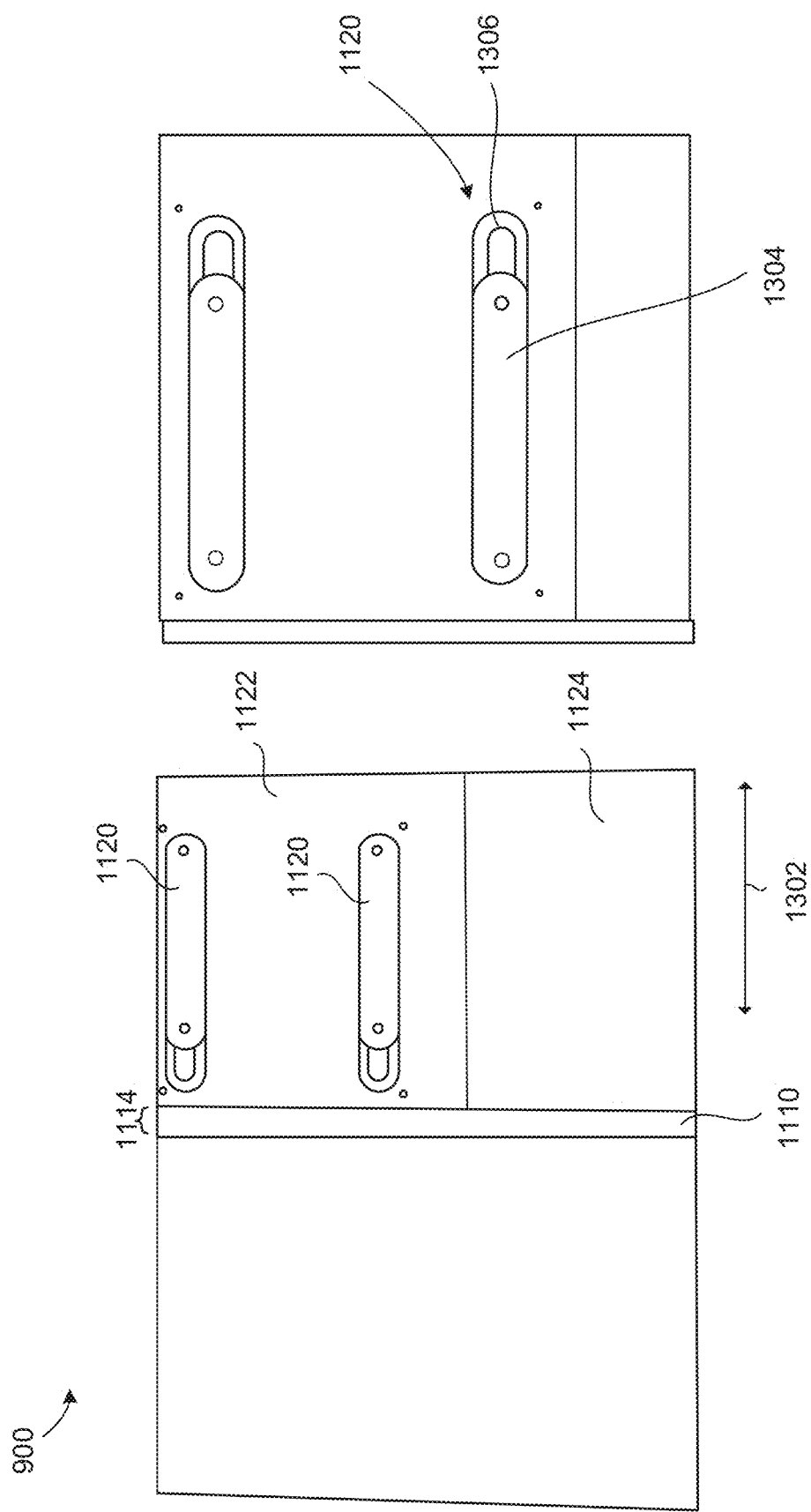

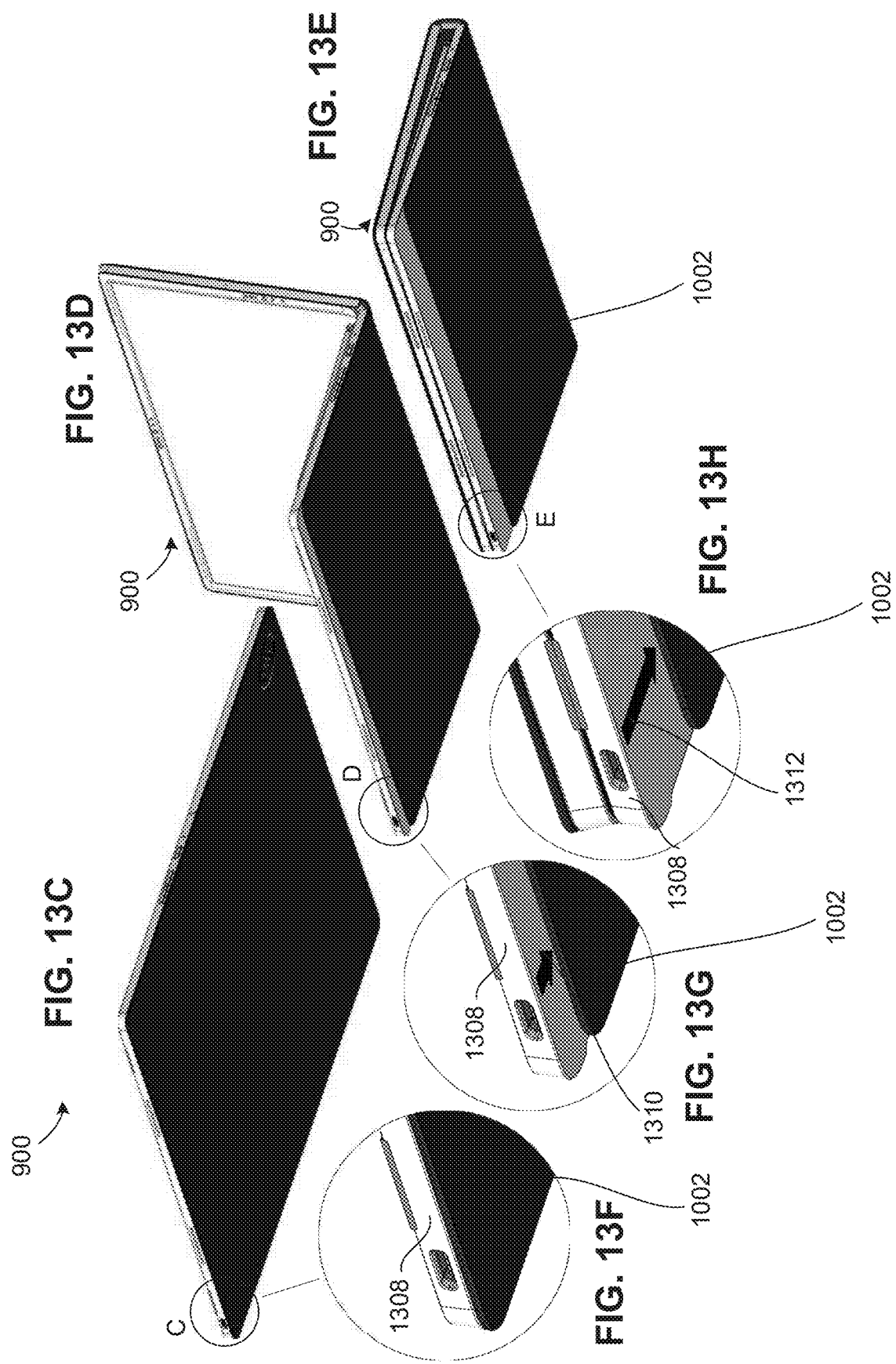

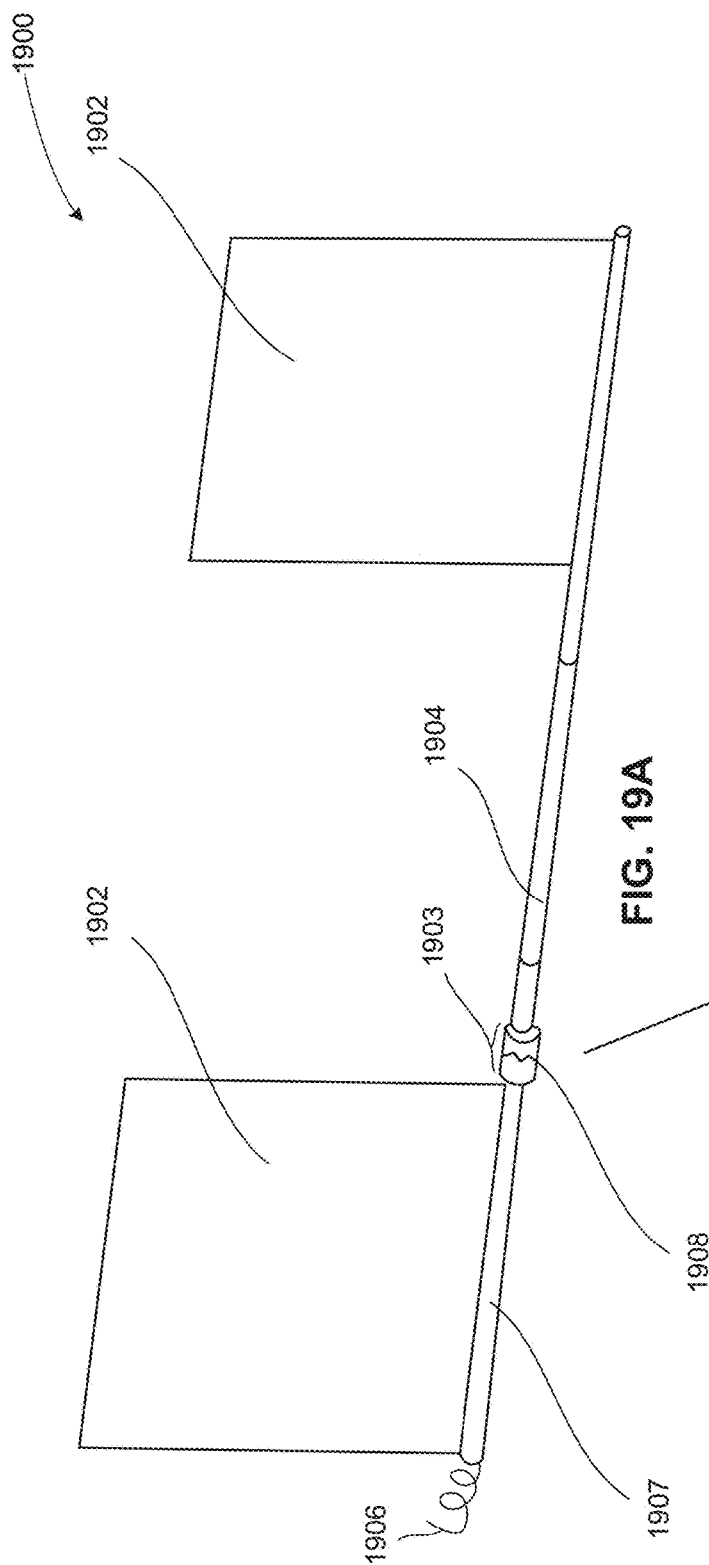
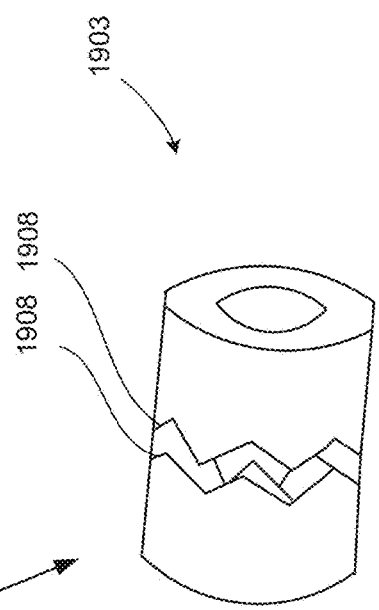
FIG. 19A
FIG. 19B

# PERSONAL COMPUTING DEVICE COVERS HAVING STANDS

RELATED APPLICATION

This patent claims priority to, and the benefit of, U.S. Provisional Patent Application Ser. No. 62/937,631, which was filed on Nov. 19, 2019. U.S. Provisional Patent Application Ser. No. 62/937,631 is hereby incorporated herein by reference in its entirety.

FIELD OF THE DISCLOSURE

This disclosure relates generally to personal computing devices and, more particularly, to personal computing device covers having stands.

BACKGROUND

In recent years, personal computing devices, such as tablets, mobile phones or laptops, utilize covers to protect displays, hardware and/or surfaces. In particular, a personal computing device usually includes a cover that is removably coupled via a magnet or other attachment device. As a result, the cover can be easily removed from the personal computing device with little or no effort. In some known implementations, the cover can also include foldable panels to allow the personal computing device to stand on a surface.

BRIEF DESCRIPTION OF THE DRAWINGS

FIGS. 3A-3C depict folding that can be implemented utilizing examples disclosed herein.

FIGS. 5A-5C depict a keyboard storage compartment that can be carried out in examples disclosed herein.

FIGS. 13A and 13B depict example slides of the cover of the example personal computing device of FIGS. 9-12.

FIGS. 13C-13H depict utilization of slides of the example personal computing device of FIGS. 9-12.

FIGS. 19A and 19B depict an example torsion rod device that can be implemented in examples disclosed herein.

Figure 1:
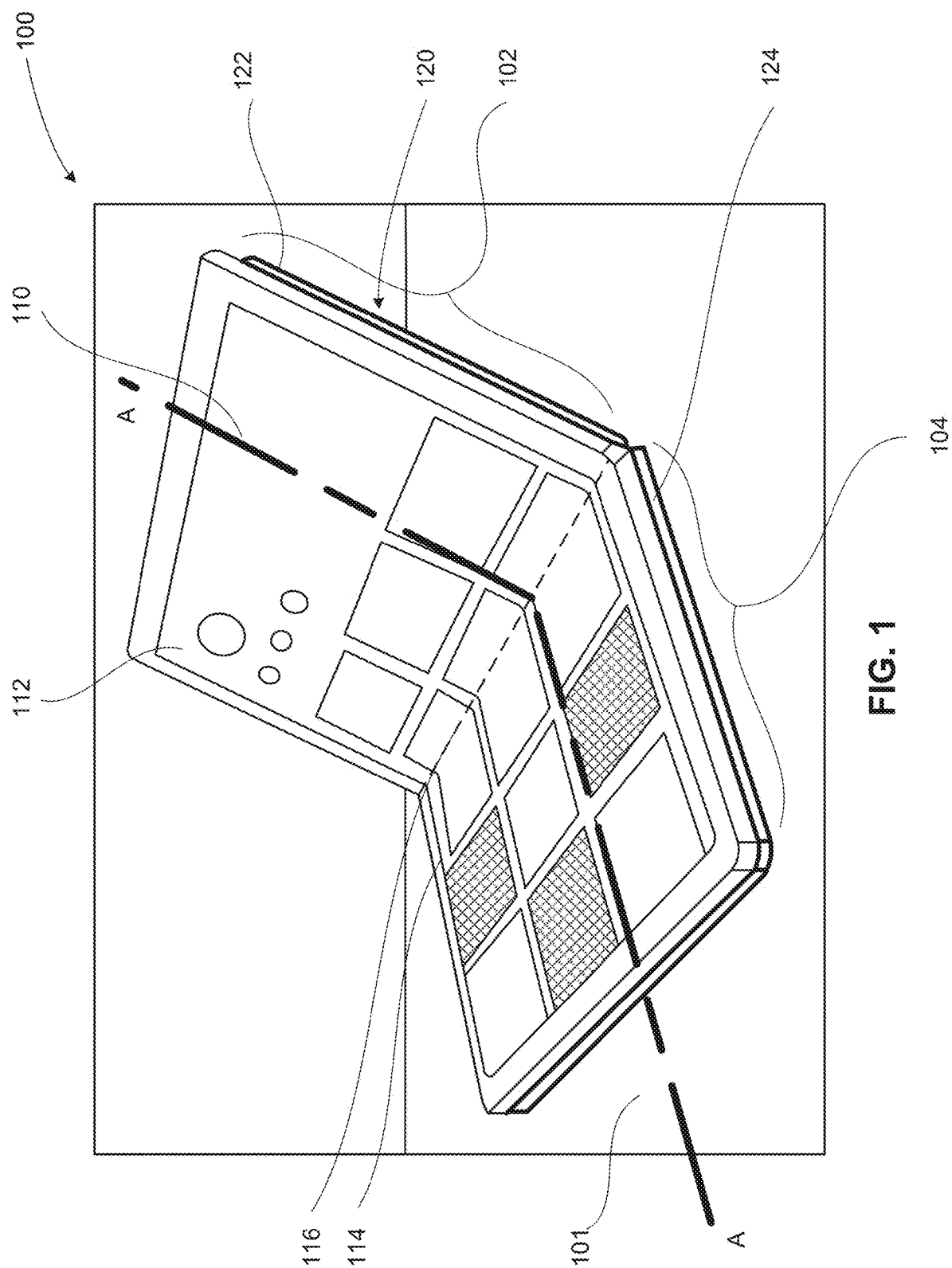
FIG. 1 is a perspective view of an example personal computing device in accordance with teachings of this disclosure.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part is in any way on (e.g., positioned on, located on, disposed on, or formed on, etc.) another part, indicates that the referenced part is either in contact with the other part, or that the referenced part is above the other part with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Thermally coupled personal computing device covers having stands are disclosed. Personal computing devices are typically attached to removable covers to mitigate and/or reduce physical damage (e.g., damage to glass and/or display surfaces, damage to external surfaces, cracking, scratches, etc.). These removable covers are often easily removable via a magnet or other retention device. As a result of being easily removable, these covers usually do not provide significant thermal conductive pathways to cool a corresponding personal computing device.

Examples disclosed herein enable thermally conductive protective covers for personal computing devices that can effectively dissipate generated heat. Examples disclosed herein provide protection to a personal computing device while also enabling effective thermal cooling thereof by implementing thermally conductive pathways from a heat generating source to a protective cover that is attached to the personal computing device. Examples disclosed herein also enable the personal computing device to be supported on a surface (e.g., a tabletop surface, a working surface, an activity surface, a desktop surface, etc.) at a desired angle (e.g., a desired viewing angle) via a deployed support (e.g., a stand, a kickstand, a foldable leg, etc.) of the protective cover.

Examples disclosed herein implement a protective cover with a fixed portion (e.g., a fixed panel, a fixed portion of a protective aesthetic cover) that is thermally coupled to a chassis of a personal computing device. In turn, the chassis is thermally coupled to a heat generating source and/or component of the personal computing device, thereby defining a thermally conductive pathway between the heat generating source and the protective cover. In other words, the fixed portion defines a heatsink of the personal computing device. The protective cover also includes a folding portion (e.g., a folding panel, a foldable panel, a foldable plate, a folding plate, etc.) that is foldable relative to the fixed portion via a hinge (e.g., a living hinge, a rotational hinge, etc.) to support the personal computing device at the aforementioned desired angle from the surface. For example, the folding portion operates as a stand defined by at least one folding panel (e.g., a rectangular folding panel, a series of rectangular folding panels, etc.).

In some examples, a thermally conductive element or component is implemented at (e.g., disposed within) a hinge positioned between the folding portion and the fixed portion to provide a thermally conductive pathway from a heat generating source and/or a chassis to a plate or heatsink of the folding portion that is embedded and/or enclosed within the folding portion (e.g., to increase a cooling area and/or to effectively distribute thermal energy throughout). In some examples, the hinge disposed between the fixed and folding portions is angled, thereby defining an angled viewing orientation of the personal computing device when the personal computing device is supported by a tabletop surface, for example. In some examples, the folding portion at least partially defines a stand with a corresponding triangular cross-sectional profile extending along a longitudinal length of the stand.

In some examples, multiple folding portions can be folded relative to the fixed portion of the protective cover. In some such examples, first and second folding portions and a fixed portion define at least three quadrants of a rectangular grid. In other examples, a first folding portion folds away from a second folding portion that is rotatably coupled to the fixed portion. In some examples, the first and second folding portions define at least one kickstand to support the personal computing device at a desired viewing angle.

In some examples, a folding portion rotatably coupled to the fixed portion includes a compartment to store a keyboard (e.g., a wireless keyboard, a wired keyboard, a removable keyboard, etc.) or any other appropriate input device (e.g., a trackpad, a mouse, a movement or gesture sensor, etc.). In some such examples, the keyboard is held within a cavity of the aforementioned compartment and against a display portion when the folding portion is positioned in a non-deployed condition. In some examples, the keyboard is wireless and removably couplable from the compartment by a user for operation with the personal computing device. Additionally or alternatively, a magnet is implemented to at least partially retain the keyboard within the cavity.

As used herein, the term "thermally coupled" refers to coupling of components, devices and/or assembles to one another such that a thermally conductive pathway is formed therebetween. Accordingly, the term "thermally coupled" can refer to layers, components, layering stacks, heat conductors and/or devices that are operatively coupled, directly or indirectly, to heat generating components or portions to define conductive thermal pathways for cooling. As used herein, the term "heatsink" refers to a component, device and/or assembly used to dissipate and/or spread heat via thermal conduction. Thus, the term "heatsink" can refer to a plate, a plate with fins, a concentric arrangement, etc.

As used herein, the term "fixed portion" refers to a portion of a component that remains relatively fixed and/or rigidly coupled to a base or chassis of a personal computing device. In other words, the term "fixed portion" can refer to at least a portion (e.g., a panel) of a protective cover or surface that remains affixed to and is not generally removed from the personal computing device. As used herein, the term "folding portion" refers to a portion of the component that displaces, folds and/or swivels away from a chassis or body of the personal computing device.

FIG. 1 is a perspective view of an example personal computing device 100 in accordance with teachings of this disclosure. The personal computing device 100 of the illustrated example is shown being supported by a surface (e.g., a desk surface, a table surface, etc.) 101. The example personal computing device 100 includes a first folding portion 102, a second folding portion 104 and a display (e.g., a foldable display, a foldable panel, a foldable monitor, etc.) 110. In this example, the display 110 includes a first display portion 112 and a second display portion 114, which can be folded and/or angled relative to one another about a hinge (e.g., a hinge line, a system hinge, a primary hinge, a folding hinge mechanism, etc.) 116. In the illustrated example, the display 110 is protected by an at least partially fixed cover (e.g., a protective cover) 120, which includes a first cover portion 122 and a second cover portion 124, both of which are not coupled to one another in this example. In particular, the first cover portion 122 and the second cover portion 124 are separated by a gap therebetween. In other examples, however, the first cover portion 122 and the second cover portion 124 are coupled together (e.g., via an intermediate component, integrated, coupled together via a living hinge, etc.).

During operation of the personal computing device in a laptop configuration, a user can place an external surface of the case associated with the second display portion 114 of the personal computing device 100 onto the surface 101 and rotate the first display portion 112 about the hinge 116 to a desired viewing angle. In some examples, the second display portion 114 can operate as a keyboard (e.g., a graphics-based keyboard) or other input device.

To operate the personal computing device 100 in a tablet configuration (e.g., a wide screen viewing configuration), the first folding portion 102 is rotated relative to the second folding portion 104 to generally align the first display portion 112 to the second display portion 114 so that the first and second display portions 112, 114 are generally oriented toward the same direction or a similar orientation (e.g., within 5 degrees of one another). In particular, the first display portion 112 and the second display portion 114 are oriented to be generally aligned with one another. As a result, both the first display portion 112 and the second display portion 114 can be viewed together as a generally contiguous/continuous single display while the personal computing device 100 is an unfolded or partially folded configuration.

Figure 2:
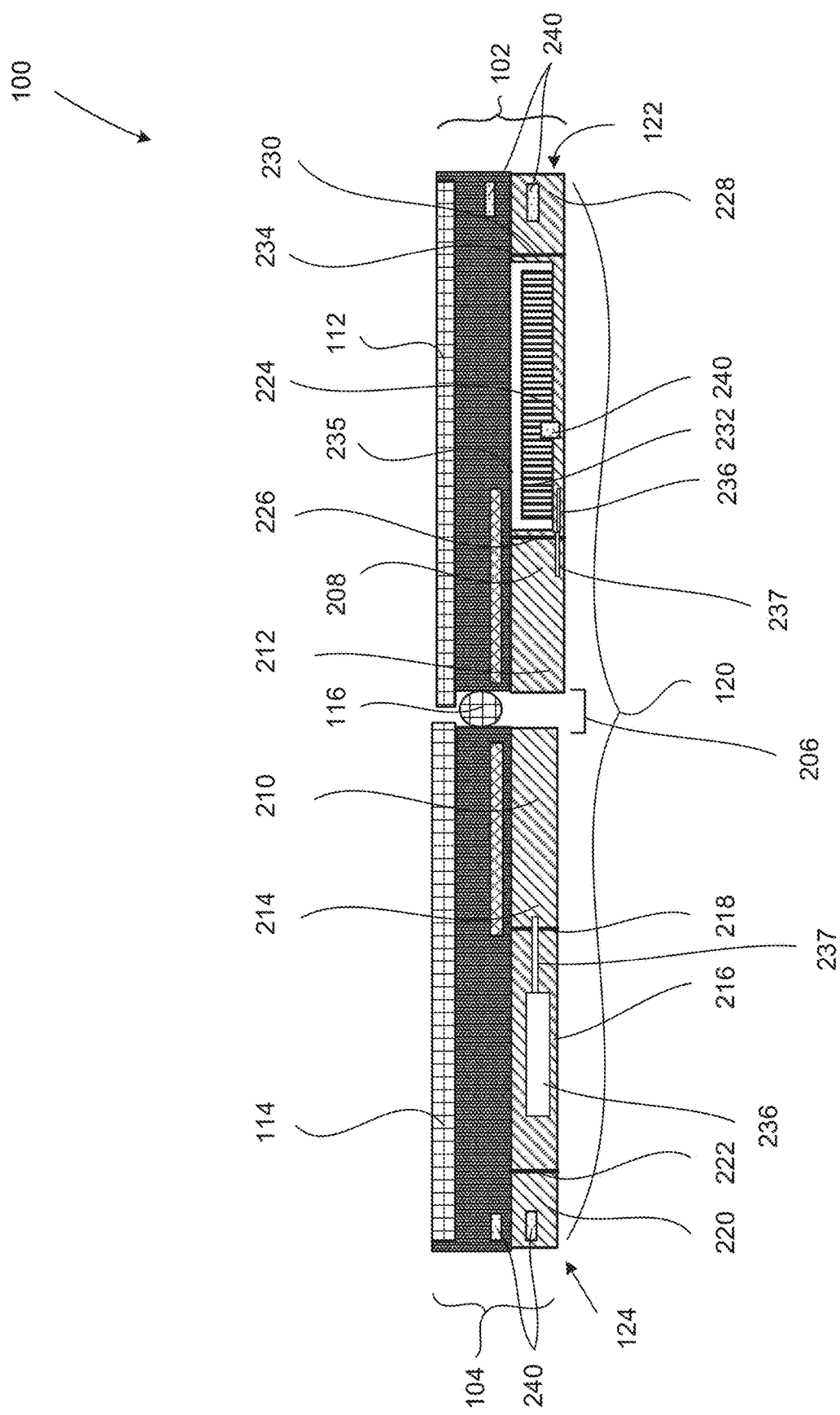
FIG. 2 is a cross-sectional view of the example personal computing device of FIG. 1 taken along a line A-A shown in FIG. 1.

FIG. 2 is a cross-sectional view of the example personal computing device 100 taken along a line A-A shown in FIG. 1 (shown in an unfolded configuration for clarity). In particular, FIG. 2 depicts the personal computing device 100 in an unfolded tablet (e.g., standing tablet, angled tablet, desktop tablet, etc.) configuration. In the illustrated example, the computing device 100 is shown with the first folding portion 102 and the second folding portion 104 depicted as deployed and folded out about the hinge 116, thereby defining a tablet configuration of the personal computing device 100. The example cover 120 includes separate first and second cover portions 122, 124, respectively, both of which are separated by a gap 206 and include multiple sequential folding panels. The first and second cover portions 122, 124 include first and second chassis bodies 208, 210, respectively. In this example, the first chassis body 208 includes a fixed portion (e.g., a fixed panel) 212 while the second chassis body 210 includes a fixed portion (e.g., a fixed panel) 214.

To enable the personal computing device 100 to stand at a desired angle (e.g., a desired viewing angle) from a surface (e.g., 30 to 60 degrees from the surface), a folding portion (e.g., a folding panel) 216 can rotate from the fixed portion 214 at a hinge (e.g., a living hinge) 218. Further, a folding portion (e.g., a folding panel) 220 can bend relative to the folding portion 216 at a hinge (e.g., a secondary hinge, a living hinge) 222. Similarly, a folding portion (e.g., a folding panel) 224 can rotate relative to the fixed portion 212 at a hinge 226, and a folding portion (e.g., a folding panel) 228 can bend relative to the folding portion 224 at a hinge 230. As will be discussed in greater detail below in connection with FIGS. 3A-8B, by moving the folding portions 216, 220, 224, 228, a multitude of use and viewing configurations are enabled. In this example, the folding portions 216, 220, 224, 228 function as foldable panels and/or plates.

To retain and/or store a keyboard (e.g., a wireless keyboard) 232, the folding portion 224 of the illustrated example includes a compartment 234. In particular, the keyboard 232 is received and retained between the compartment 234 and a rear surface 235 of the first display portion 112 (e.g., the keyboard 232 is removably coupled). In some examples, the keyboard 232 is retained by (e.g., snapped into, magnetically retained by, etc.) features, such as detents, tabs or snaps, for example, of the compartment 234. In other examples, the keyboard 232 is simply placed into the compartment 234 and held in place by the folding portion 224 being pressed against the first display portion 112. In other examples, a compartment to retain the keyboard 232 is defined on the first display portion 112 and/or the second display portion 214 instead of the folding portion 224.

To define thermally conductive cooling pathways for the personal computing device 100, the fixed portions 212, 214 are thermally coupled to heat generating components disposed within the personal computing device 100. In particular, thermally conductive components (e.g., conductive layers, chassis parts, thermal gaskets, etc.) are coupled to and/or disposed between the fixed portions 212, 214 and the corresponding heat generating components. Accordingly, the fixed portions 212, 214 function as heatsinks (e.g., while maintaining an aesthetic look consistent with the cover 120). Further, in the illustrated example, at least one conductor 237 is implemented to conduct heat away from the fixed portions 212, 214 to cooling plates 236 of the respective folding portions 216, 224. In other words, the folding portions 216, 224 can operate as heat sinks to dissipate heat generated by the personal computing device 100. In some such examples, at least one of the conductors 237 is flexible and extends through a length of the respective hinges 218, 226. Additionally or alternatively, at least one of the conductors 237 extends through the hinges 222, 230. Accordingly, in such examples, the cooling plates 236 can be implemented in the distal folding portions 220, 228.

In some examples, magnets 240 are included to hold the folding portions 216, 220, 224, 228 in a desired position and/or orientation. For example, at least one of magnets 240 is used to hold at least two of the folding portions 216, 220, 224, 228 together (e.g., hold at a desired angle and/or displacement relative to one another). Additionally or alternatively, the magnets 240 retain the keyboard 232 in the compartment 234. While four of the folding portions 216, 220, 224, 228 are shown in this example, any appropriate number of folding portions can be implemented instead. In some examples, at least one of the hinges 218, 222, 226, 230 is implemented as a living hinge. In other examples, the hinges 218, 222, 226, 230 are implemented as hinge components (e.g., a hinge assembly, an axial hinge mechanism, etc.).

FIGS. 3A-3C depict example folding that can be implemented utilizing examples disclosed herein. Turning to FIG. 3A, the personal computing device 100 is shown an unfolded tablet configuration in which the cover 120 is unfolded to cause the first display portion 112 and the second display portion 114 to be generally oriented in the same direction. In particular, the folding portions 224, 228 are generally aligned with the fixed portion 212 and, similarly, the folding portions 216, 220 are generally aligned with the fixed portion 214. As a result, the personal computing device 100 is operated in a tablet display mode.

Turning to FIG. 3B, the personal computing device 100 is shown in a partially folded condition. In the illustrated example, the personal computing device 100 is shown during folding such that the folding portion 224 is folded away from the first display portion 112. In the depicted partially folded condition, the folding portions 216, 220 remain generally aligned with the second display portion 114. Further, the keyboard 232 remains within the compartment 234.

FIG. 3C depicts the personal computing device 100 in a fully folded position to enable the personal computing device 100 to be supported by a surface. In this example, the computing device 100 can stand on the surface due to the folding portion 224 and the folding portion 216 contacting one another at a defined angle (e.g., 25 to 75 degrees) and defining a stand with a triangular cross-sectional profile that extends longitudinally. In some examples, at least one of the folding portion 220 or the folding portion 228 is folded onto at least one of the folding portion 216 or the folding portion 224 to at least partially define the aforementioned triangular cross-sectional profile. In other words, the folding portion 220 and/or the folding portion 228 can function as distal folding tabs or lips. Additionally or alternatively, the magnets 240 shown in FIG. 2 can be used to constrain and/or couple the folding portions 216, 220, 224, 228 to one another (e.g., at a desired relative rotational displacement). In this example, the keyboard 232 is wirelessly operated at a distance from (e.g., separate from) the personal computing device 100.

Figure 4A:
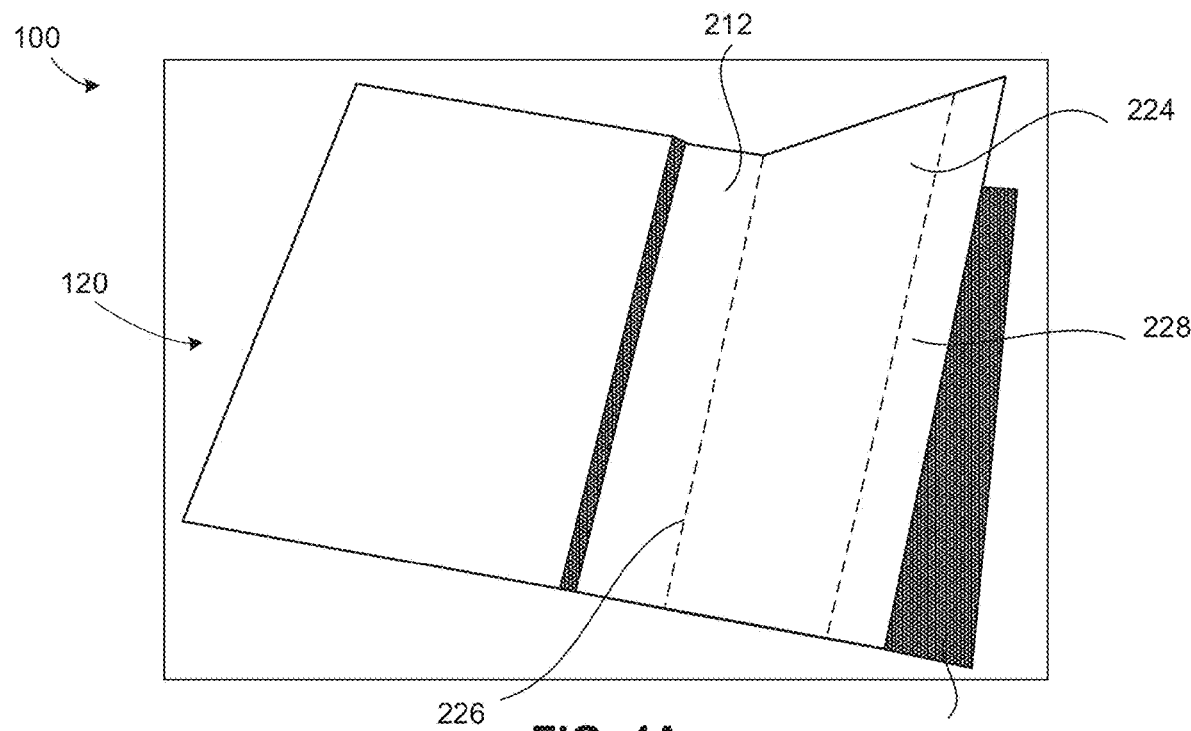
FIGS. 4A and 4B depict folding of an example cover disclosed herein.
Figure 4B:
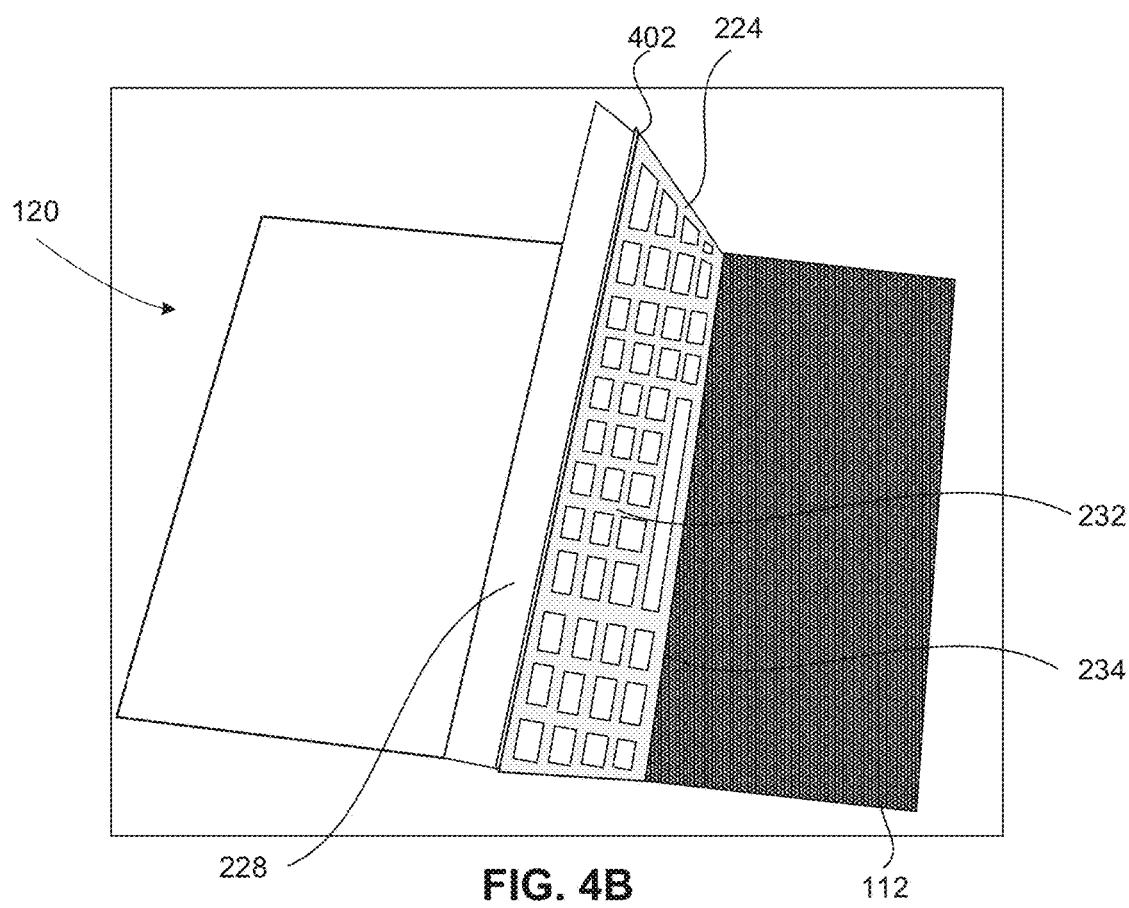

FIGS. 4A and 4B depict folding of the example cover 120 utilizing examples disclosed herein. FIG. 4A depicts the personal computing device 100 in a partially folded position in which the folding portions 224, 228 are angled from the fixed portion 212 at the hinge 226 and away from the first display portion 112. In this example, the folding portions 224, 228 are generally aligned with one another.

Turning to FIG. 4B, the folding portion 224 of the cover 120 is shown angled further away from the first display portion 112 in comparison to the view of FIG. 4A. As can be seen in the illustrated example of FIG. 4B, the keyboard 232 remains retained by the compartment 234. In some examples, the keyboard 232 is at least partially retained by the distal folding portion 228. In some such examples, the keyboard 232 is removed from the compartment 234 by overcoming a magnetic force associated with the folding portion 224 and/or the folding portion 228. Additionally or alternatively, the folding portion 224 and/or the folding portion 228 includes a ledge or protrusion 402 to at least partially restrain the keyboard 232.

FIGS. 5A-5C depict an example folding configurations that can be carried out in examples disclosed herein. Turning to FIG. 5A, the personal computing device 100 is shown standing on a surface with the folding portions 216, 224 deployed, but not angled and/or folded to contact one another. In this example, the personal computing device 100 can stand on the surface without the folding portions 216, 224 contacting one another or being folded onto one another because the folding portions 216, 224 extend outwardly and away from the personal computing device 100. In some other examples, magnets of the folding portions 216, 224 repel one another. In some examples, a rotational detent or torsional lock is implemented to maintain the folding portions 216, 224 at corresponding outwardly deployed angular positions.

Turning to FIG. 5B, a rear view of the personal computing device 100 is shown. In the illustrated example, the folding portions 216, 224 are angled toward one another and brought into contact with one another (e.g., the folding portions 216, 224 are removably coupled from one another in a non-standing mode of the personal computing device 100), thereby defining a stand (e.g., a standing portion) of the personal computing device 100. In other words, folding of the folding portions 216, 224 transforms and/or deploys the cover 120 into a stand. In this example, the folding portions 220, 228 are folded to contact and/or be retained by the respective other one of the folding portions 216, 224. In particular, the folding portion 220 is folded to contact an exterior side of the folding portion 224 while the folding portion 228 is folded to contact an interior side of the folding portion 216, thereby defining a triangular-shaped cross-sectional profile of the stand. This example triangular-shaped cross-sectional profile extends along a longitudinal length of the stand.

While a triangular cross-sectional profile is defined by the folding portions 216, 220, 224, 228, any appropriate cross-sectional shape may be applied instead, including, but not limited to, square, rectangular, pentagon, hexagon, etc. In other examples, any other number of folding portions may be implemented (e.g., four, five, ten, twenty, fifty, etc.).

FIG. 5C depicts a frontal view of the personal computing device 100 with the keyboard 232 separated therefrom. In particular, the cover 120 of the illustrated example is folded to support the personal computing device 100 while the keyboard 232, which is a wireless keyboard in this example, is operated at a distance from the personal computing device 100 after being removed from the cover 120.

Figure 6A:
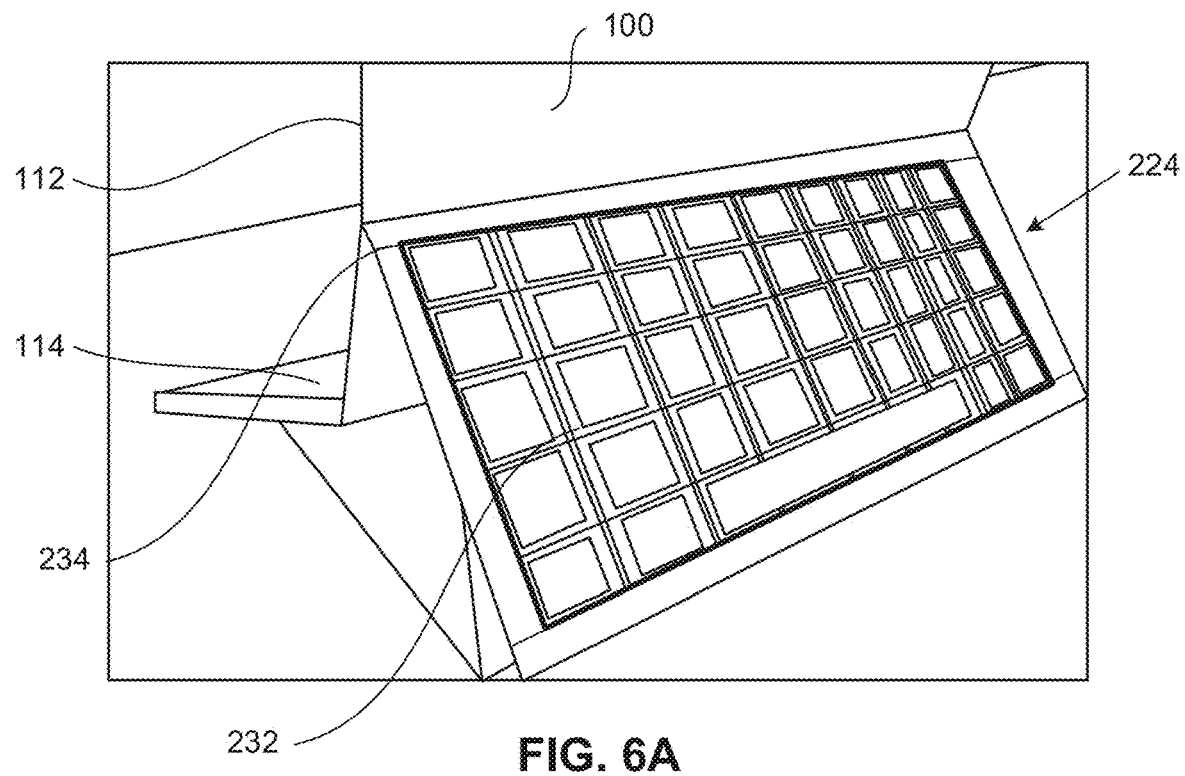
FIGS. 6A and 6B depict example folding configurations that can be implemented in example covers disclosed herein.
Figure 6B:
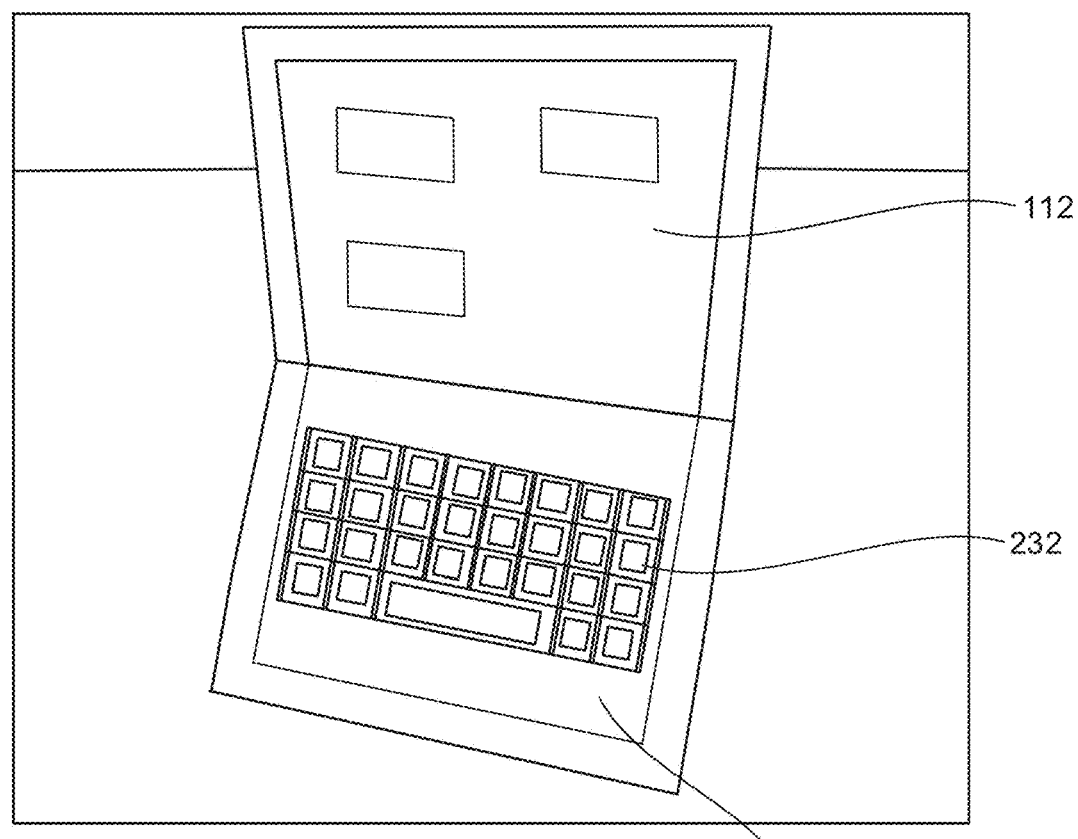

FIGS. 6A and 6B depict example folding positions that can be carried out in examples disclosed herein. In the view of FIG. 6A, the personal computing device 100 is shown in a laptop operation mode in which the keyboard 232 remains stowed in the compartment 234 of the folding portion 224. As a result, the keyboard 232 is not used in this configuration and is stored at an opposite side from the first and second display portions 112, 114. In some examples, the second display portion 114 functions as a keyboard or input device (e.g., a virtual keyboard).

Turning to FIG. 6B, an alternative laptop configuration is shown. In contrast to the example laptop configuration shown in FIG. 6A, the keyboard 232 is placed onto one of the display portions 112, 114. In particular, the keyboard 232 sits on or is supported by a surface of the display portion 112 or the display portion 114. In some examples, the surface includes a protrusion or other alignment feature to position, support, retain and/or hold the keyboard 232. Additionally or alternatively, a magnet (e.g., an internal magnet) is implemented to position and/or retain the keyboard 232 relative to the aforementioned surface.

Figure 7:
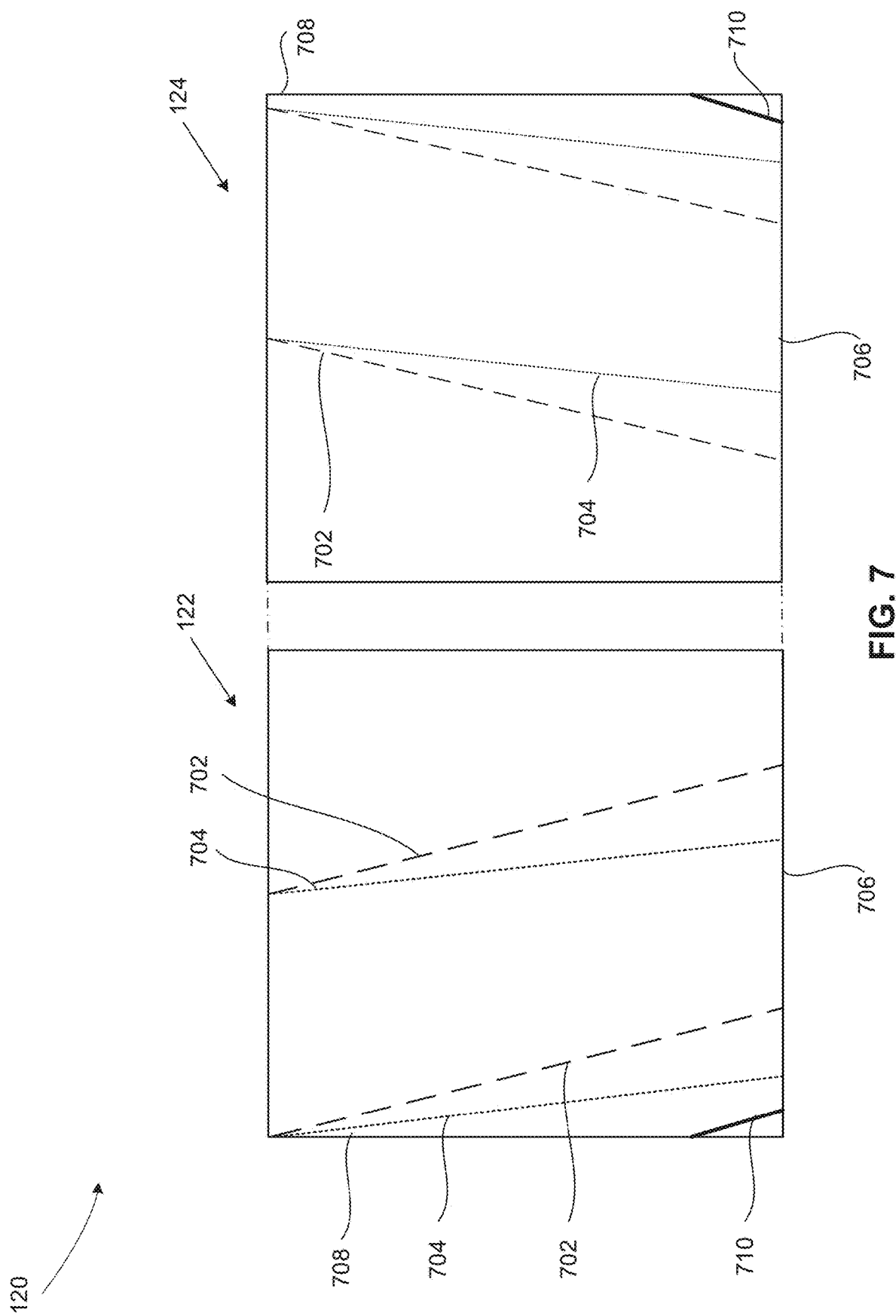
FIG. 7 depicts example fold lines that can be implemented in example covers disclosed herein.

FIG. 7 depicts example angled fold lines 702, 704 that can be implemented in example covers disclosed herein. In this example, the fold lines 702, 704 are implemented on the cover portions 122, 124 of the cover 120. In the illustrated view of FIG. 7, the fold lines 702 represent a first supported angle (e.g., a first viewing angle) of the personal computing device 100 while the fold lines 704 represent a second supported angle (e.g., a second viewing angle) of the personal computing device 100. The fold lines 702, 704 of the illustrated example are angled relative to an edge 706 and/or side edges 708. However, the fold lines 702, 704 can be angled relative to any other appropriate reference feature and/or datum. Additionally or alternatively, a chamfer (e.g., a chamfered edge) 710 is implemented to define a standing angle of the personal computing device 100.

Figure 8A:
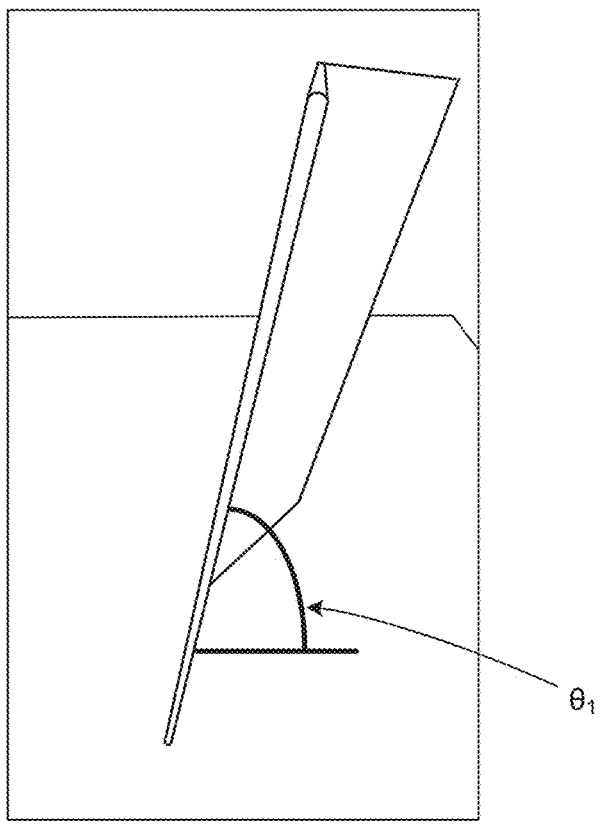
FIGS. 8A and 8B depict resultant standing angles associated with the example fold lines of FIG. 7.
Figure 8B:
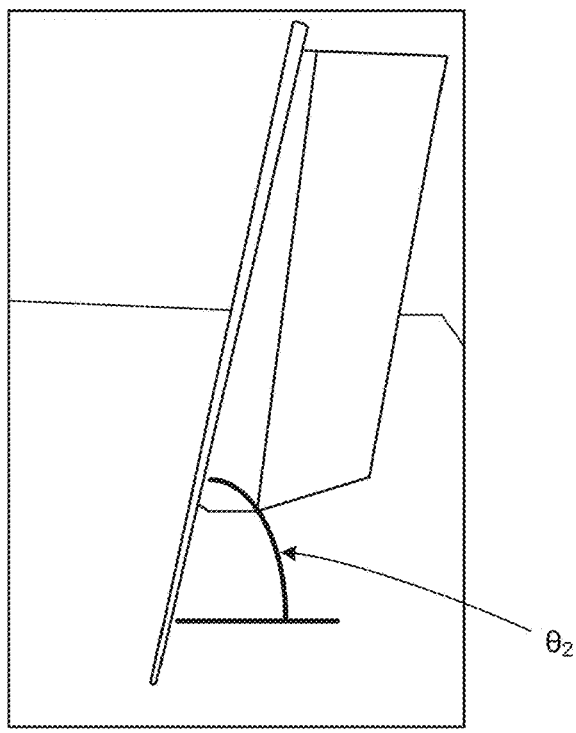

FIGS. 8A and 8B depict resultant standing angles associated with the example fold lines 702, 704 shown in FIG. 7. In particular, FIG. 8A pertains to folding of the fold lines 704, as generally indicated by $\Theta_1$, while FIG. 8B pertains to folding of the fold lines 702, as generally indicated by $\Theta_2$. In the illustrated example, FIG. 8B and the fold lines 702 pertain to a steeper viewing angle in contrast to the example of FIG. 8A corresponding to the fold lines 704. In other words, implementing multiple angled fold lines onto a single cover enables a selection of multiple different viewing angles.

Figure 9:
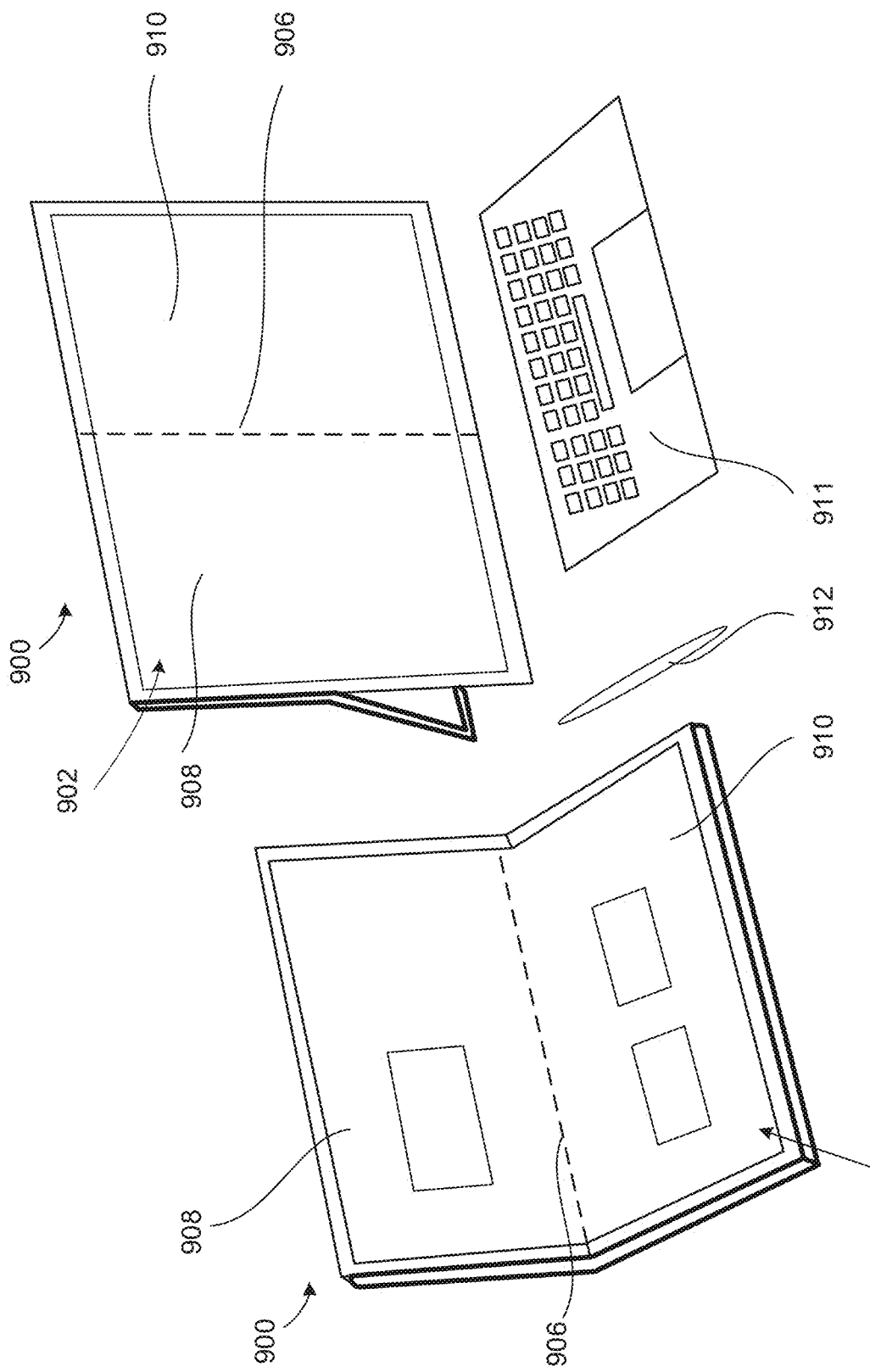
FIG. 9 depicts an alternative example personal computing device in accordance with teachings of this disclosure.

FIG. 9 depicts an alternative example personal computing device 900 in accordance with teachings of this disclosure. In the illustrated view of FIG. 9, two of the personal computing devices 900 are shown for clarity to illustrate differences between a dual screen laptop configuration and a standing tablet configuration (e.g., an angled tabletop configuration) of the personal computing device 900. In this example, the personal computing device 900 includes a foldable display 902 with a fold line 906 that separates a first display portion 908 from a second display portion 910.

In the aforementioned dual screen laptop configuration (shown on the left side in the view of FIG. 9), the first display portion 908 operates as a display that is oriented toward a user while the second display portion 910 can operate as an additional display or a user interface (e.g., a graphical user input device, a virtual keyboard, a virtual trackpad, etc.). In this example, the first display portion 908 can be folded about the fold line 906 relative to a table surface on which the personal computing device 900 sits to orient the first display portion 908 at a desired viewing angle toward the user. In some examples, the keyboard 911 is implemented as an input device. Additionally or alternatively, a stylus 912 is implemented as an input device for the personal computing device 900.

When the personal computing device 900 is operated as a standup tablet (shown on the right side in the view of FIG. 9), the first display portion 908 is angled about the fold line 906 at approximately 180 degrees from the second display portion 910. In this example, this relative angular position between the first display portion 908 and the second display portion 910 is an angular limit that defines a full extent of how far the first display portion 908 can be angled from the second display portion 910. In other examples, however, the first display portion can be unfolded from the second display portion at an angle greater than 180 degrees. In the aforementioned standup tablet configuration, a greater amount of screen surface area can be utilized and/or viewed in comparison to the laptop configuration.

Figure 10:
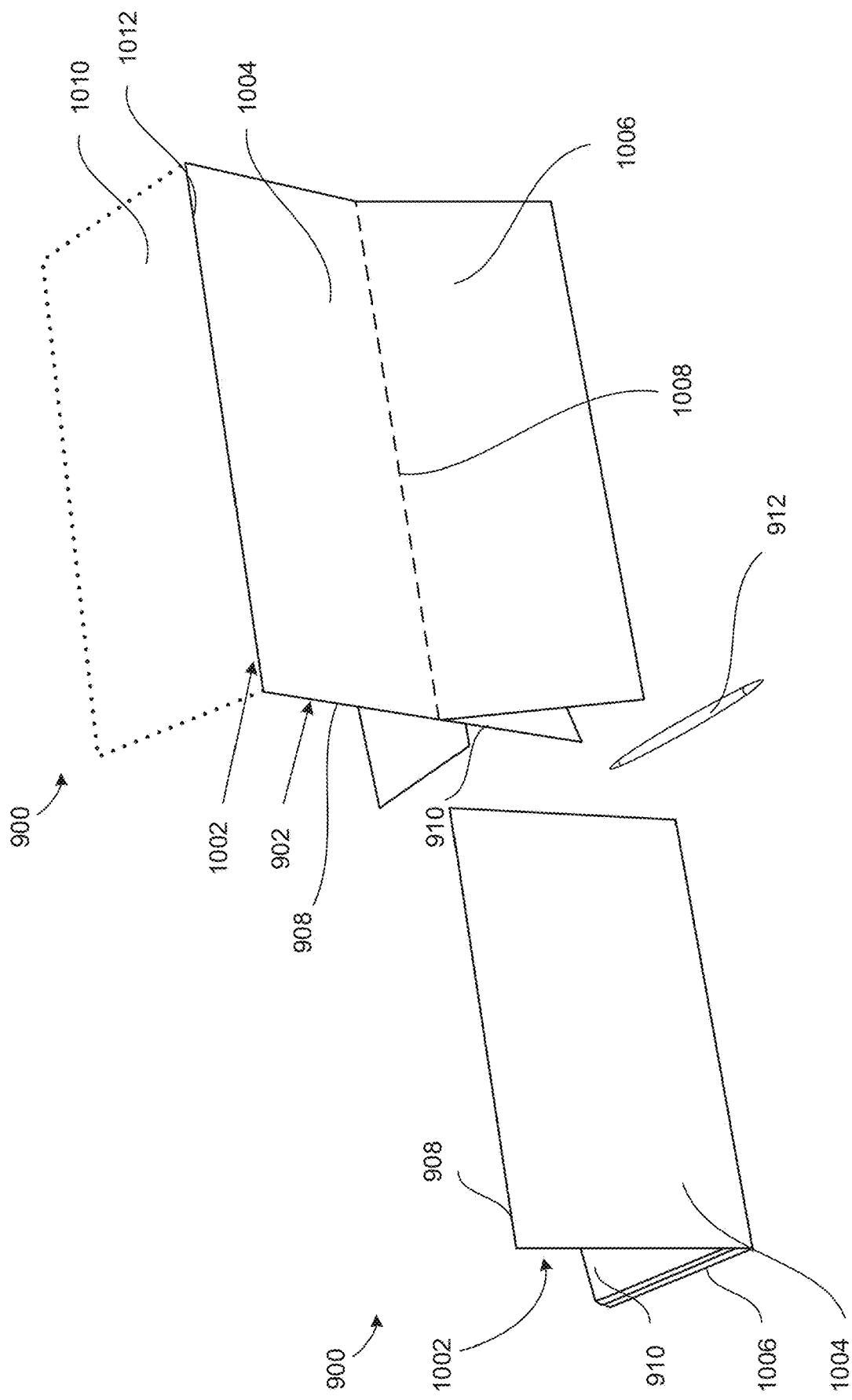
FIG. 10 is a rear view depicting the example personal computing device of FIG. 9.

FIG. 10 is a rear view depicting the example personal computing device 900 of FIG. 9. In the illustrated view of FIG. 10, both the laptop and standup tablet configurations are shown together for clarity. The example personal computing device 900 includes a cover (e.g., a non-removable cover, a partially non-removable cover, a semi-fixed cover, etc.) 1002 to provide protection to at least a rear surface of the personal computing device 900. The example cover 1002 includes a fixed upper portion 1004 and a folding portion or stand (e.g., a kickstand, a full width kickstand, a partial width kickstand, a multiple leg kickstand, etc.) 1006.

To orient the first display portion 908 and the second display portion 910 at a desired orientation, the folding portion 1006 of the illustrated example can swivel and/or rotate relative to the fixed portion 1004 about a hinge (e.g., a locking hinge, a living hinge, a membrane hinge, a ratcheting hinge, etc.) 1008. Further, the folding portion 1006 is generally locked and/or held at a rotational displacement to maintain the first display portion 908 and the second display portion 910 at the desired orientation. In some examples, the folding portion 1006 can be locked into multiple different angular positions about the hinge 1008. In the standing tablet configuration (shown on the right side of FIG. 10), an angular displacement between the second display portion 910 and the folding portion 1006 supports the personal computing device 900 in a relatively stable manner. In other words, the folding portion 1006 and the second display portion 910, both of which contact a surface and are sufficiently angled from one another to provide a stable support base for the personal computing device 900.

In addition to adjusting an orientation of the personal computing device 900, the cover 1002 protects the personal computing device 900 from damage and/or unwanted cosmetic wear (e.g., blemishes, scratches, marks, etc.) while also providing thermally conductive pathways for electronics of the personal computing device 900, thereby dissipating a relatively significant amount of generated heat from the personal computing device 900 and, thus, cooling the personal computing device 900. As a result, components of the personal computing device 900 can be potentially run at relatively high/higher clock speeds, for example. In other words, the cover 1002 acts as an effective heat spreader and/or heat dissipation device in addition to a stable surface mount.

In some examples, the cover 1002 includes an additional folding portion 1010. In particular, the folding portion 1010 can be implemented to fold over onto at least a portion of the foldable display 902. In some such examples, the folding portion 1010 rotates about a hinge 1012, which is, in turn, coupled to the fixed portion 1004. In other words, the folding portion 1010 is rotatably coupled to the fixed portion 1004. In some such examples, the folding portion 1010 can protect the foldable display 902 when the personal computing device 900 is standing at a desired viewing angle. Additionally or alternatively, the folding portion 1010 is expandable and/or retractable to enable variation of a degree to which the foldable display 902 is covered and/or protected.

Figure 11:
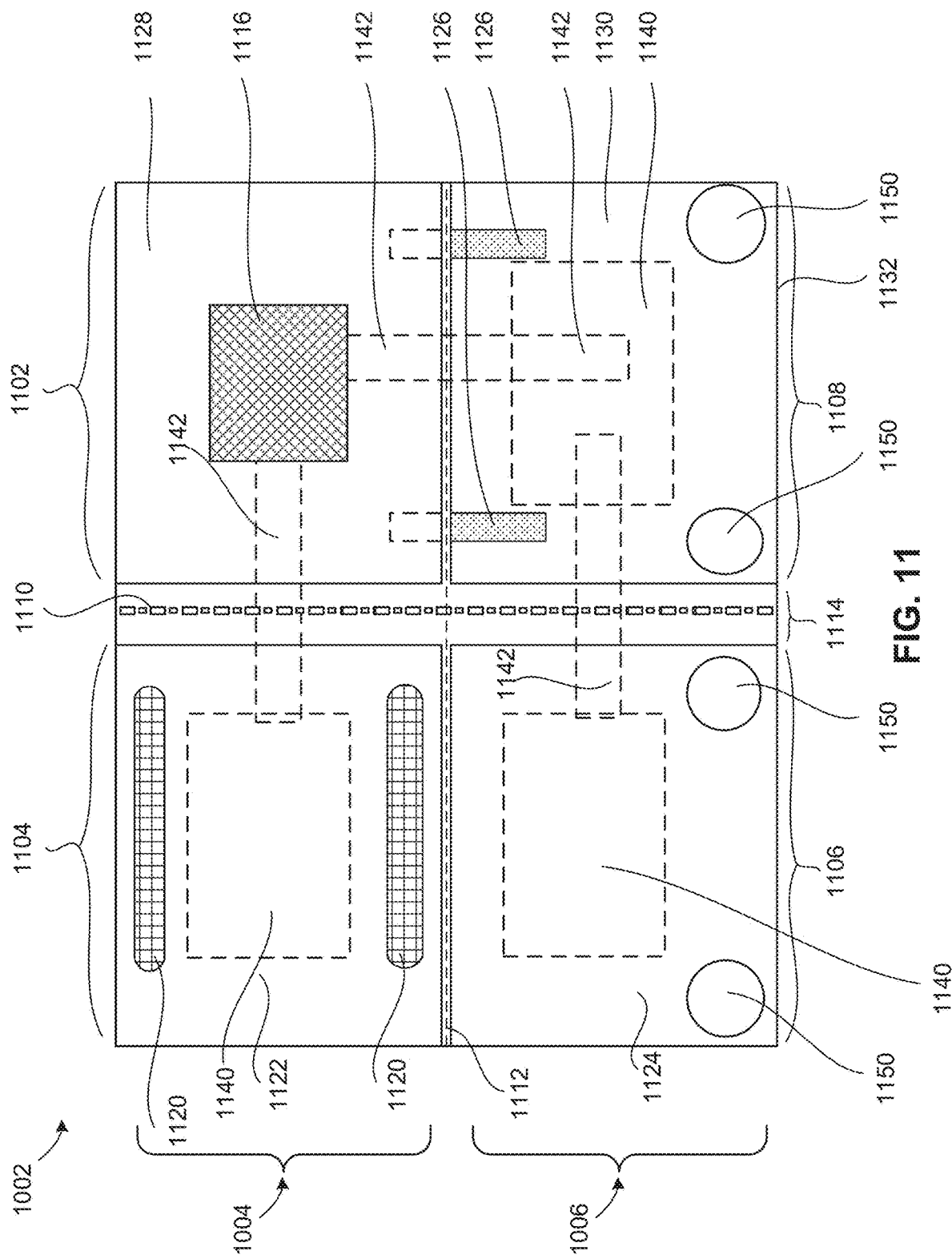
FIG. 11 is a detailed view of a cover of the example personal computing device of FIGS. 9 and 10.

FIG. 11 is a detailed view of the cover 1002 of the example personal computing device 900 of FIGS. 9 and 10. In the illustrated example, the cover 1002 defines quadrants 1102, 1104, 1106, 1108, all of which are generally rectangular in shape and separated from one another via fold lines (e.g., living hinges, pivots, etc.) 1110, 1112. In this example, the fold line 1112 is defined by the hinge 1008 shown in FIG. 10. Further, the example quadrants 1106, 1108 define the folding portion or stand (e.g., folding panel(s), foldable panel(s)) 1006 while the quadrants 1102, 1104 define the fixed portion 1004. In some examples, the fold line 1110 is at least partially defined by a flexible band (e.g., a compressible band, a movable coupling band, a movable band, a ribbon band, etc.) 1114.

As mentioned above, the quadrant 1102 of the illustrated example is generally rectangular in shape and defines and/or includes a heat generating portion of the personal computing device 900. In particular, the quadrant 1102 includes a thermally conductive portion 1116 to conduct heat from a board and/or heat generating components (e.g., board-mounted heat generating components) positioned internal to the personal computing device 900 (e.g., positioned or packaged within a housing of the personal computing device 900). In other words, the quadrant 1102 of the cover 1002 acts as a heatsink and is rigidly coupled to a chassis and/or body of the personal computing device 900 to define thermally conductive cooling pathways and, accordingly, the quadrant 1102 is generally inseparable and/or unremovable from the personal computing device 900, in this example. However, the quadrant 1102 still retains a general outer look and/or aesthetic look of the cover 1002 in this example. Accordingly, the quadrant 1102 may have an identical aesthetic look to the quadrants 1104, 1106, 1108.

In this example, the quadrant 1104 is also rigidly fixed to a chassis or other structure of the personal computing device 900 and includes slides (e.g., sliding tabs, sliders, slide structure(s), etc.) 1120 to enable panels (e.g., protective panels) 1122, 1124 of the quadrant 1104 and the quadrant 1106, respectively, to be displaced (left/right in the view of FIG. 11) relative to panels 1128, 1130, respectively, of the quadrants 1102, 1108 to enable fit adjustments of the cover 1002 to account for variations related to folding, folding length and/or flexibility of the cover 1002 and/or flexibility (e.g., a bend radius) associated with the foldable display 902 (not shown). While two of the slides 1120 are shown in this example, any appropriate number of the slides 1120 can be implemented instead (e.g., one, three, four, five, ten, twenty, fifty, one hundred, etc.).

In the illustrated example, support hinges 1126 are operationally coupled between the panels 1128, 1130 of the quadrants 1102, 1108, respectively. The example support hinges 1126 function to hold the quadrants 1106, 1108 angled relative to the fixed quadrants 1102, 1104, thereby enabling the personal computing device 900 to be supported at a desired viewing angle, for example. In this example, a bottom surface and/or edge 1132 of the quadrants 1106, 1108 at least partially contacts a supporting surface (e.g., a tabletop surface) to support the personal computing device 900.

In some examples, at least one of the quadrants 1102, 1104, 1106, 1108 includes a thermally conductive plate (e.g., a heatsink plate, a heat spreader, a copper spreader, etc.) 1140 to function as a heatsink. In some such examples, the conductive plate 1140 is conductively coupled (e.g., mechanically coupled) to the conduction portion 1116 for cooling thereof via a corresponding conductor (e.g., a graphite conductors, an evaporative cooling device, a heat pipe, a flexible heat conducting ribbon, etc.) 1142, which may extend through at least one of the fold lines 1110, 1112. In some examples, magnets 1150 are implemented to at least partially retain and/or restrain the quadrants 1106, 1108 when they are folded out to support the personal computing device 900 at a desired viewing angle. For example, the magnets 1150 can be attracted to a portion of the foldable display 902 shown in FIG. 9 and/or magnets attached to the foldable display 902. In some examples, at least one of the conductors 1142 and/or the conductive plate 1140 is at least partially composed of graphite. However, any appropriate material can be implemented instead (e.g., copper, aluminum, steel, etc.).

Figure 12:
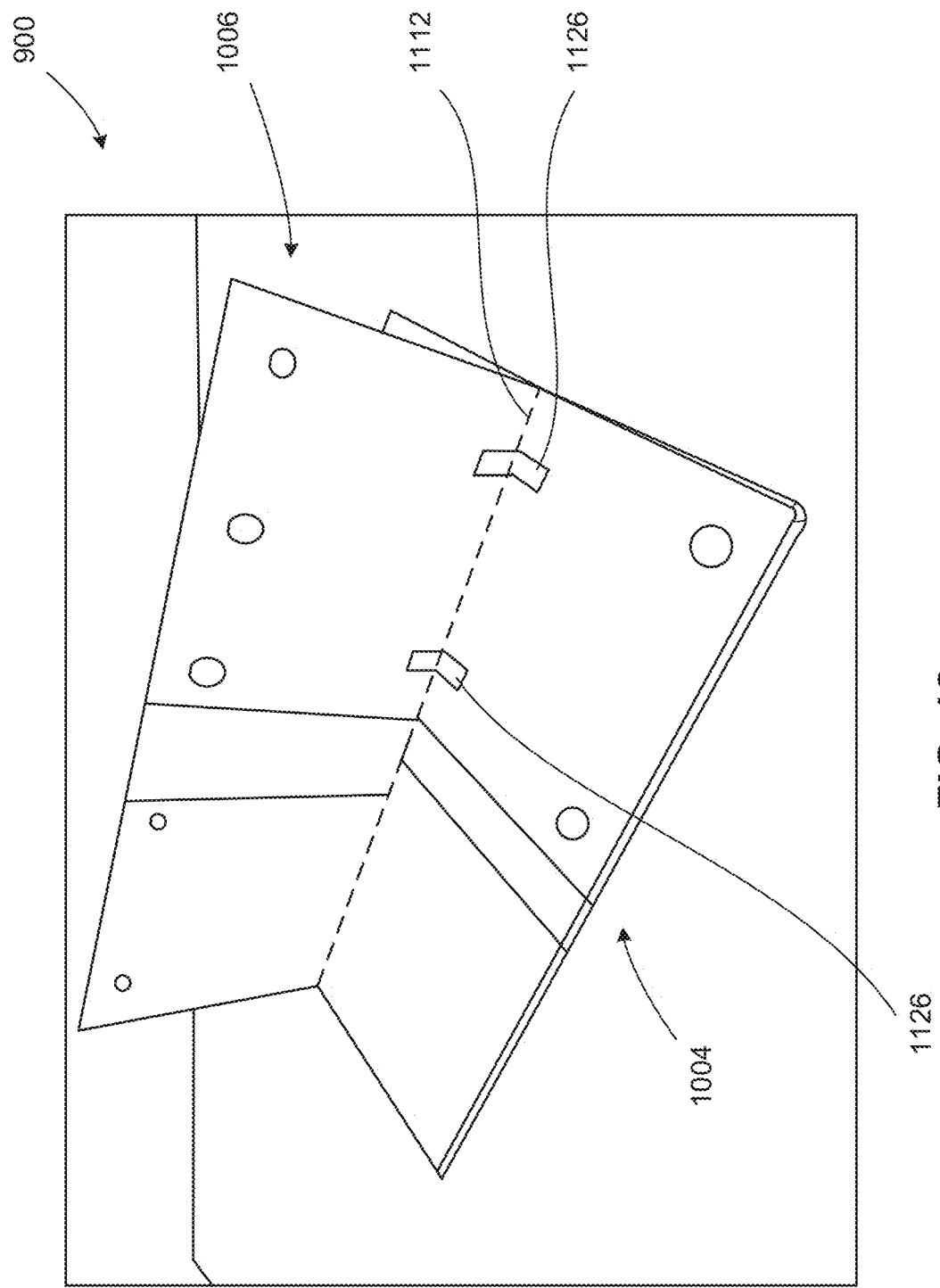
FIG. 12 depicts rotational movement of a folding portion of the cover of the example personal computing device of FIGS. 9-11.

FIG. 12 depicts rotational movement of the folding portion 1006 of the example personal computing device 900 of FIGS. 9-11. As can be seen in the illustrated example of FIG. 12, the support hinges 1126 enable the folding portion 1006 to be angled away from the fixed portion 1004. In particular, the support hinges 1126 allow the folding portion 1006 to be rotated about the fold line 1112 at a desired angle relative to the fixed portion 1004 (e.g., to a desired viewing angle, to an ergonomic position, etc.) while locking and/or restraining movement of the folding portion 1006.

FIGS. 13A and 13B depict the slides 1120 of the cover 1002 of the example personal computing device 900 of FIGS. 10-12. In the illustrated example of FIG. 13A, the slides 1118 are shown arranged in parallel to one another on the panel 1122 on a rear side (e.g., a non-display side) of the personal computing device 900. In operation, the slides 1118 enable the panels 1122, 1124 to displace and/or translate relative to the fold line 1110. In particular, the panels 1122, 1124 can be moved sideways (left and right in the view of FIG. 13A), as generally indicated by a double arrow 1302, to accommodate folding and/or tolerance variations of the flexible band 1114 and/or the foldable display 902 when the foldable display 902 is angled.

Turning to FIG. 13B, a detailed view of the slides 1120 is shown. In the illustrated example each one of the slides 1120 includes a slider body 1304 that is rigidly coupled to the foldable display 902 and a corresponding groove (e.g., a linear movement groove) 1306. In particular, the slider body 1304 is sized relative to an inner surface of the groove 1306 to enable linear movement of the slider body 1304 within the groove 1306.

To adjust for a length variation when folding the personal computing device 900, the slider body 1304 moves within the groove 1306 in a linear direction, thereby allowing the panels 1122, 1124 to be moved relative to the foldable display 902. In this example, a relative sizing between the slider body 1304 and the groove 1306 determines a degree to which an amount of length variation can be accounted for. In some other examples, the slider body 1304 and the groove 1306 enable movement in multiple degrees of freedom (e.g., a peg within a circular hole, a multi-axis joint, etc.).

FIGS. 13C-13H depict utilization of slides of the example personal computing device of FIGS. 9-12. FIG. 13C depicts the personal computing device 900 in a tablet mode while FIG. 13D depicts the personal computing device 900 in a laptop mode. FIG. 13E depicts the personal computing device 900 in a closed or stored mode.

FIG. 13F is a detailed view of a region C denoted in FIG. 13C. In this example, the cover 1002 (e.g., the foldable portion 1006) is shown generally aligned with an outer edge 1308. In particular, the cover 1002 is shown generally flush with the outer edge 1308 based on the aforementioned slides 1120.

Turning to FIG. 13G, a detailed view of a region D of FIG. 13D is shown. In this example, the cover 1002 is displaced relative to the aforementioned outer edge 1308, as generally indicated by an arrow 1310. In this example, the slides 1120 (not shown) enable the cover 1002 to accommodate length changes during folding thereof.

FIG. 13H is a detailed view of a region E of FIG. 13E. In the illustrated example, the cover 1002 is displaced from the outer edge 1308, as generally indicated by an arrow 1312. As mentioned above, the slides 1120 enable adjustment of the cover 1002 even during different folding configurations of the personal computing device 900. In some examples, the slides 1120 enable the outer edge 1308 to be generally flush with the cover 1002 in the tablet mode, the laptop mode and/or the closed/stored mode (e.g., all of the modes of the personal computing device 900).

Figure 14:
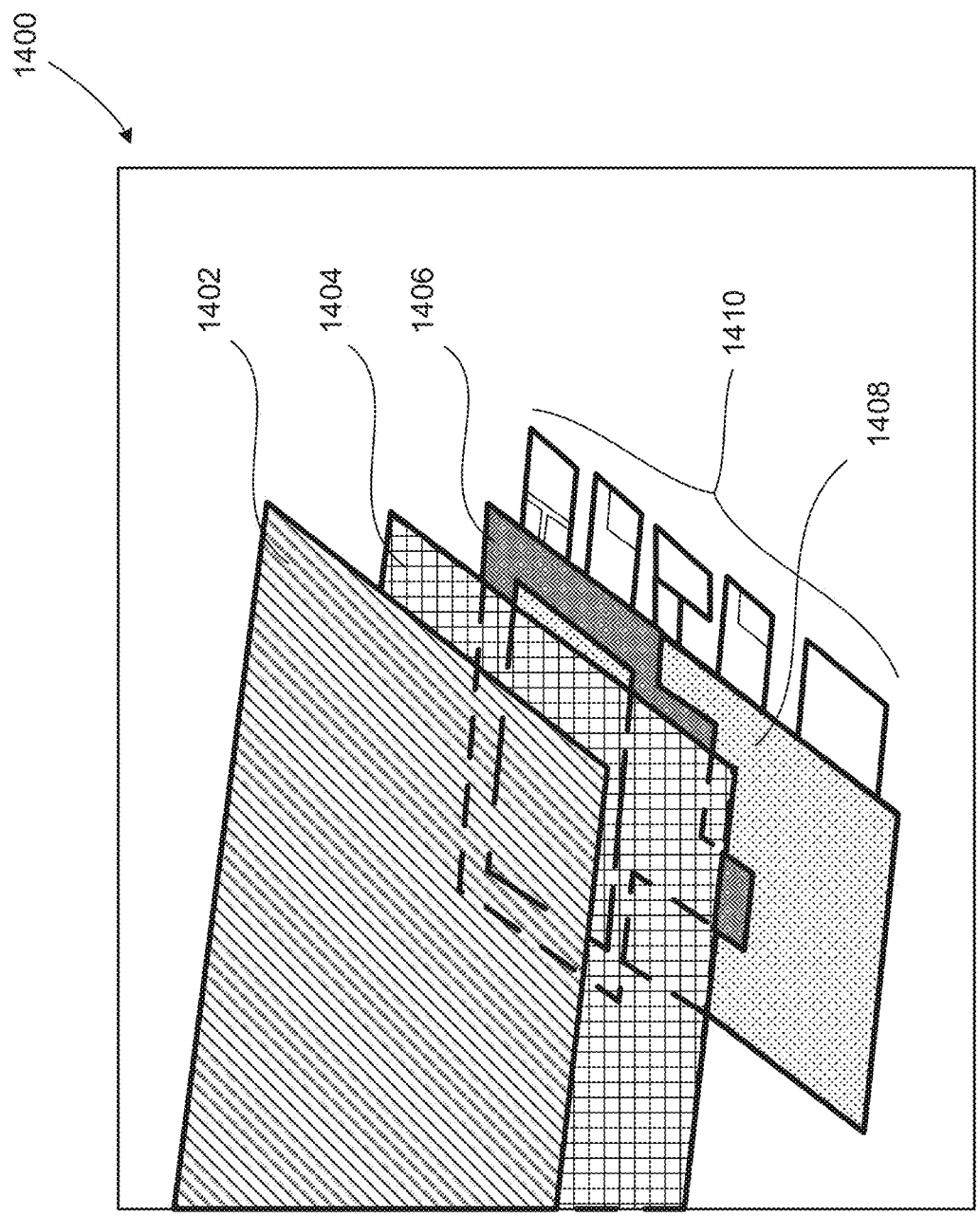
FIG. 14 is an exploded view of a layered chassis construction that can be implemented in examples disclosed herein.

FIG. 14 is an exploded view of an example chassis construction 1400 that can be implemented in examples disclosed herein. The chassis construction 1400 of the illustrated example can be implemented in the panel 1128 of the quadrant 1102 shown in FIG. 11. In the illustrated example, the chassis construction 1400 includes an outer surface 1402, which is at least partially composed of leather in this example, a graphite layer 1404, an inner frame (e.g., a metal inner frame,) 1406, a chassis 1408 and a heat generating source (e.g. a printed circuit board, an electrical device, etc.) 1410. The example chassis construction 1400 can provide highly effective heat transfer to the cover 1002 and the corresponding structures therein. However, any appropriate construction or arrangement can be implemented instead.

Figure 15:
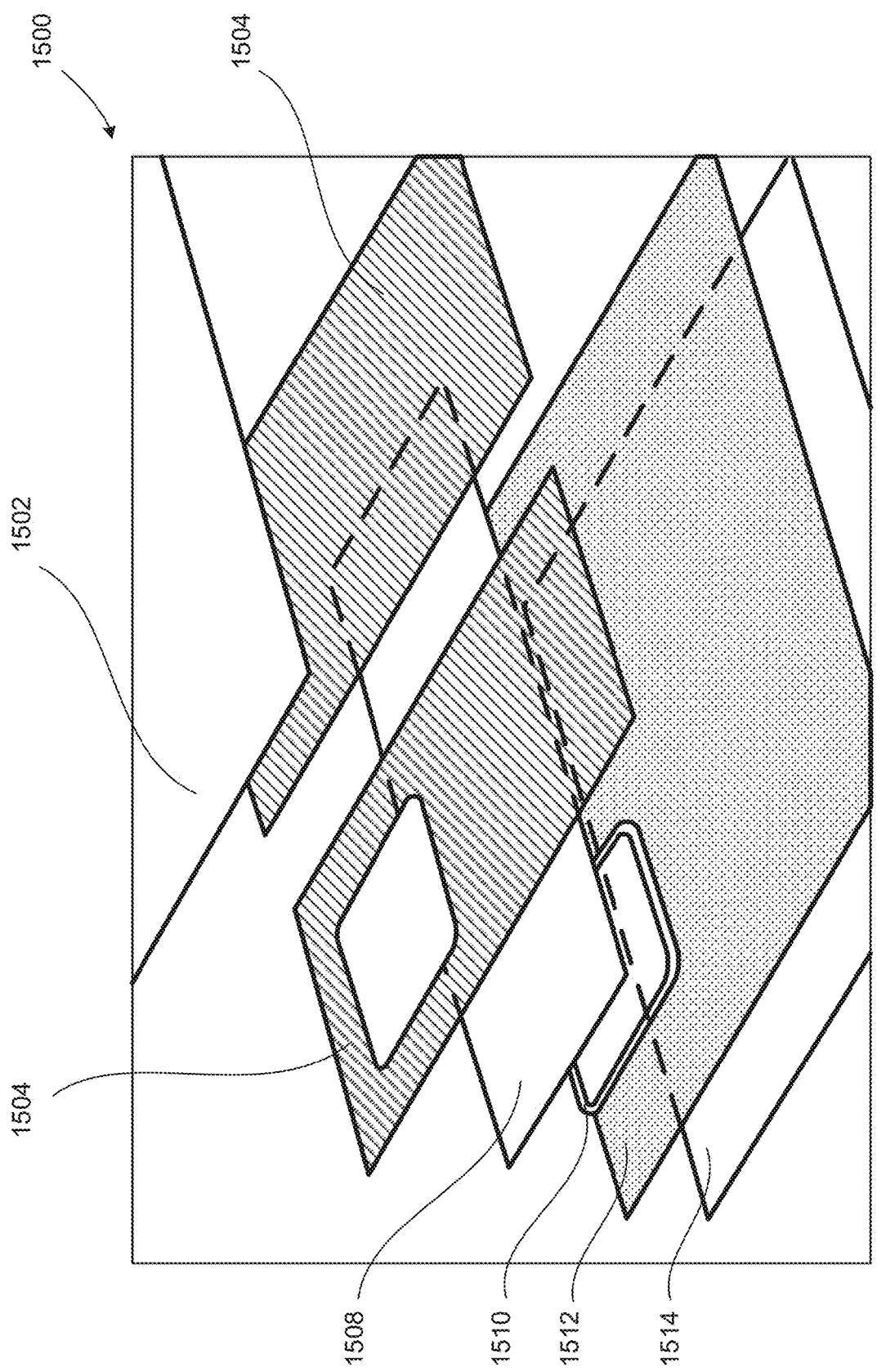
FIG. 15 is an exploded view of a layered cover construction that can be implemented in examples disclosed herein.

FIG. 15 is an exploded view of a cover construction 1500 that can be implemented in examples disclosed herein. For example, the cover construction 1500 can be implemented in the outer surface 1402 shown in FIG. 14. The cover construction 1500 of the illustrated example includes a cosmetic cover 1502, which is composed of polyurethane rubber in this example, a composite layer 1504, a graphite layer 1508 with a metal insert (e.g., a magnet) 1510, a composite layer 1512 and a leather (or leather-like material) layer 1514. However, any appropriate cover construction can be implemented instead. In this particular example, the leather layer 1514 prevents a user from contacting a significantly high temperature surface. In other words, the leather layer 1514 can function as a heat insulator from user skin contact when heat is dissipated and/or spread through the cover 1002.

Figure 16:
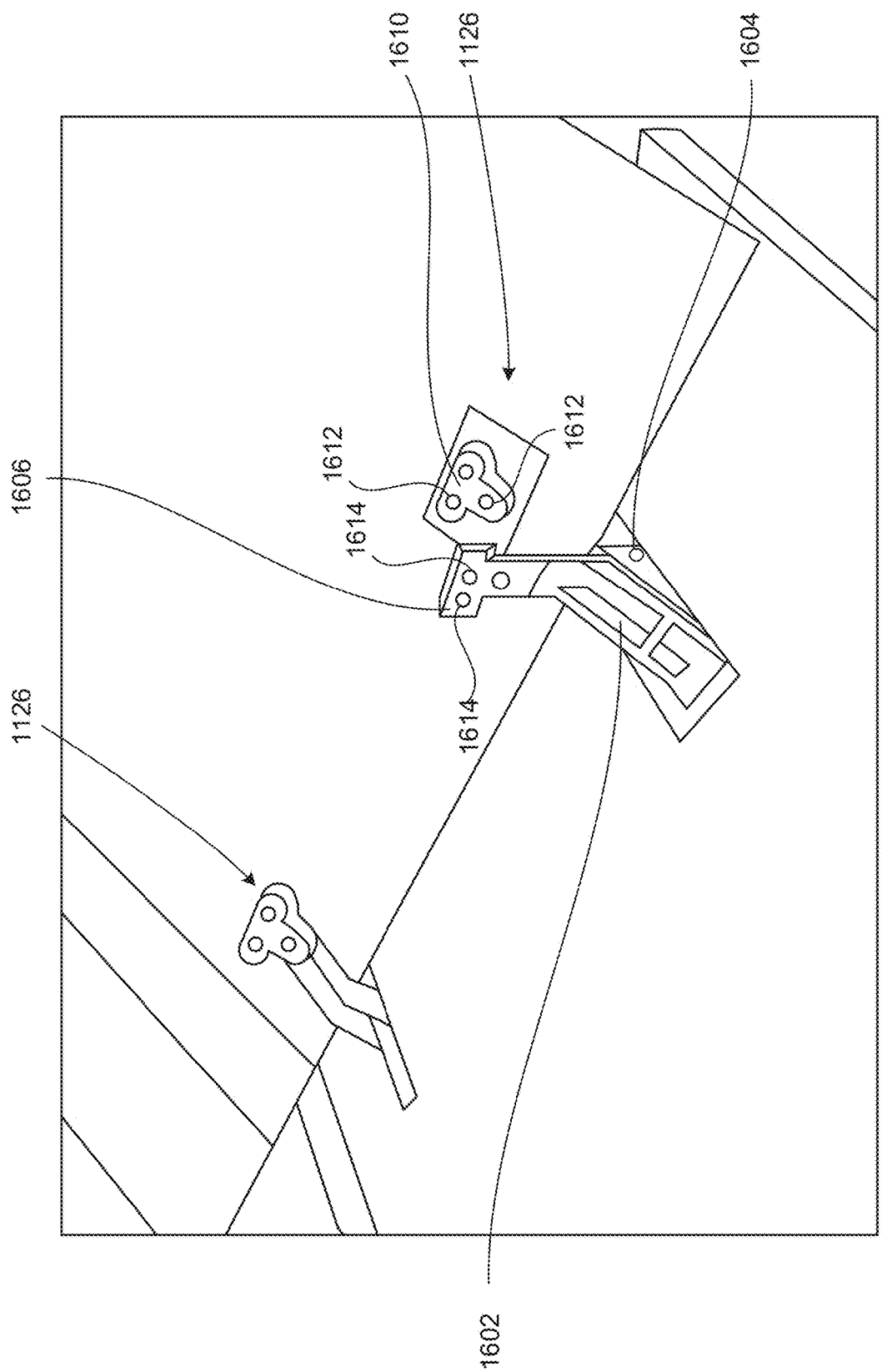
FIG. 16 depicts an example hinge device that can be implemented in examples disclosed herein.

FIG. 16 depicts a hinge device that can be implemented in examples disclosed herein. In the illustrated example of FIG. 16, the hinge supports 1126 are shown. The hinge supports 1126 include a base 1602, a pivot 1604, a contact interface 1606 and a coupling mount 1610. In this example, the coupling mount 1610 is composed of stainless steel. However, any appropriate material can be implemented instead. Further, the contact interface 1606 and the coupling mount 1610 are coupled together via three mechanical fasteners that are threaded into apertures 1612 and pass through apertures 1614. However, any appropriate number of fasteners or attachment methodology (e.g., chemical fastening, welding, etc.) can be implemented instead.

Figure 17B:
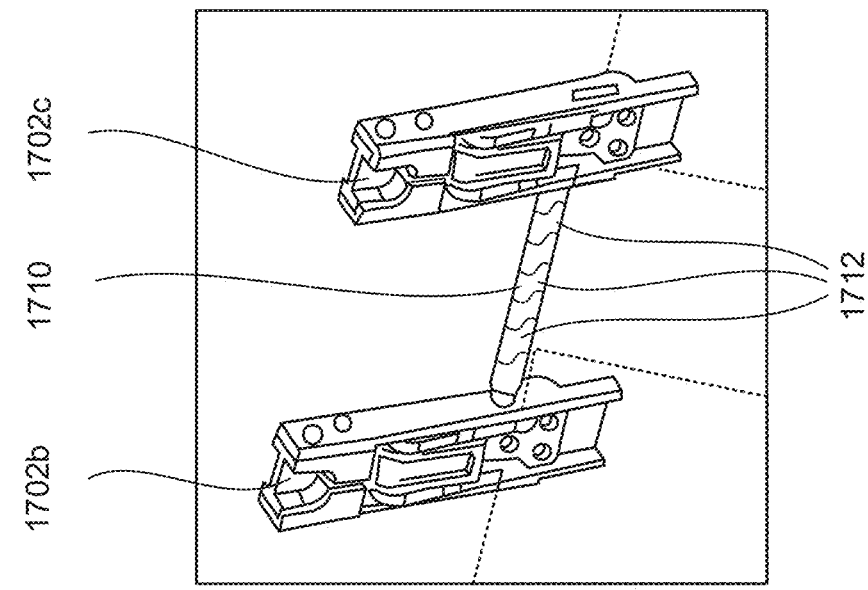
FIGS. 17A and 17B depict an alternative example hinge device that can be implemented in examples disclosed herein.
Figure 17A:
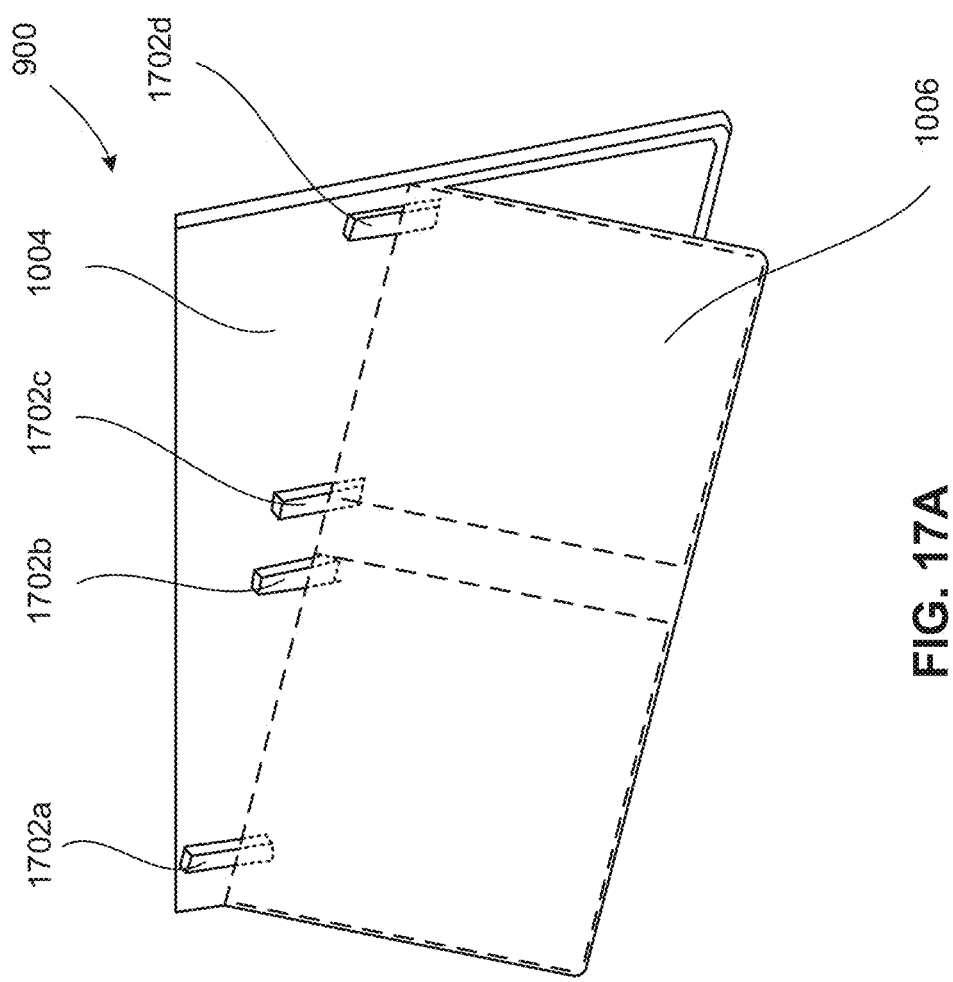

FIGS. 17A and 17B depict an example hinge device that can be implemented in examples disclosed herein. Turning to FIG. 17A, an arrangement of hinge supports 1702 (hereinafter 1702a, 1702b, 1702c, 1702d, etc.) are shown operatively coupled between the folding portion 1006 and the fixed portion 1004 of the personal computing device 900. In particular, four of the hinge supports 1702 are implemented in this example. However, any appropriate number of the hinge supports 1702 can be implemented instead.

Turning to FIG. 17B, a detailed view of the hinge supports 1702b, 1702c is shown. In this example, a sync axle 1710 is implemented to enable simultaneous movement of the hinge supports 1702a, 1702b, 1702c, 1702d. In some examples, the sync axle 1710 is implemented as multiple links 1712.

Figures 18A, 18B:
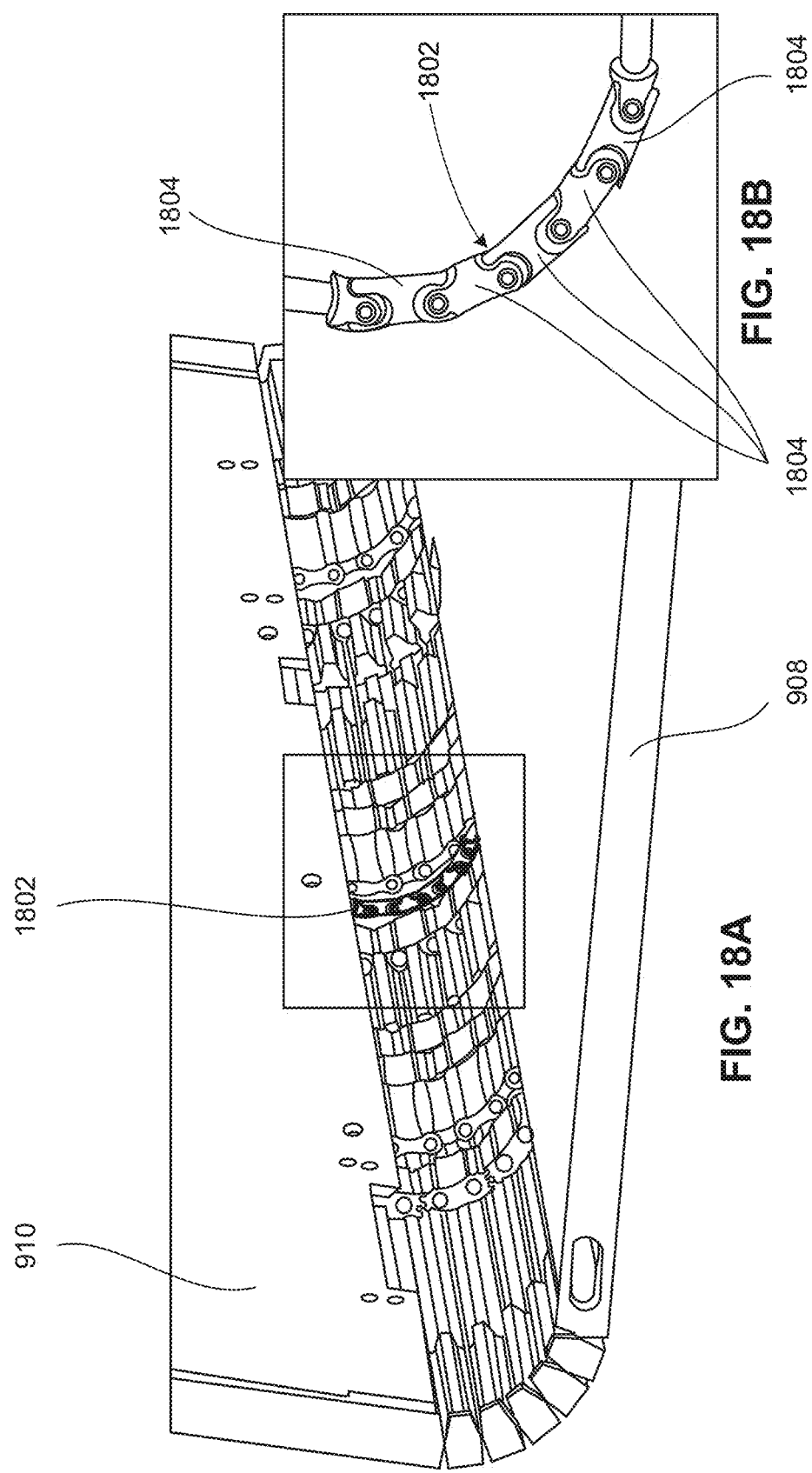
FIGS. 18A and 18B depict an example hinge mechanism that can be implemented in examples disclosed herein.

FIGS. 18A and 18B depict an example hinge mechanism 1802 that can be implemented in examples disclosed herein. In the illustrated view of FIG. 18A, the hinge 1802 is shown operatively coupled between the first display portion 908 and the second display portion 910. Turning to FIG. 18B, a detailed view of the hinge 1802 is shown. In particular, multiple links 1804 are shown defining the hinge 1802. The example links 1804 enable a gradual bend so that bending stresses and/or component separation can be minimized (e.g., eliminated).

FIGS. 19A and 19B depict an example torsion rod device 1900 that can be implemented in examples disclosed herein to support and/or position the folding portion 1006. In particular, the torsion rod device 1900 can be used to implement multiple kickstands of the folding portion 1006. Turning to FIG. 19A, the torsion rod device 1900 includes kickstand plates 1902, both of which can at least partially define the folding portion 1006. In some examples, the kick stand plates 1902 are thermally coupled to heat generating sources of the personal computing device 900 for thermal spreading. In particular, the kickstand plates 1902 are integrated into the folding portion 1006 (e.g., embedded within the folding portion 1006). The torsion rod device 1900 also includes an axial wheel gear 1903, a torsion rod 1904, a spring 1906 and a drive rod 1907.

In operation, the torsion rod 1904 carries an axial load or moment over a hinge area associated with the folding portion 1006. Further, the spring 1906 of the illustrated example acts as compression spring to maintain an axial force directed to teeth 1908 of the axial wheel gear 1903. Moreover, the teeth 1908 are allowed to slip relative to one another when a threshold force is exceeded, thereby preventing damage of the folding portion 1006 and/or an associated hinge structure of the torsion rod device 1900. To re-synchronize the teeth 1908 when multiple kickstands are implemented, a respective one of the multiple kickstands of the folding portion 1006 can be rotated against a force of the spring 1906 to close the kickstands into a non-deployed position from the fixed portion 1004.

FIG. 19B depicts a detailed view of the axial wheel gear 1903 having the aforementioned teeth 1908. In this example, the teeth 1908 are implemented as relatively sharp angled cuts that provide a resistive force when rotated against one another. However, any appropriate teeth geometry and/or gearing can be implemented instead.

Figure 20:
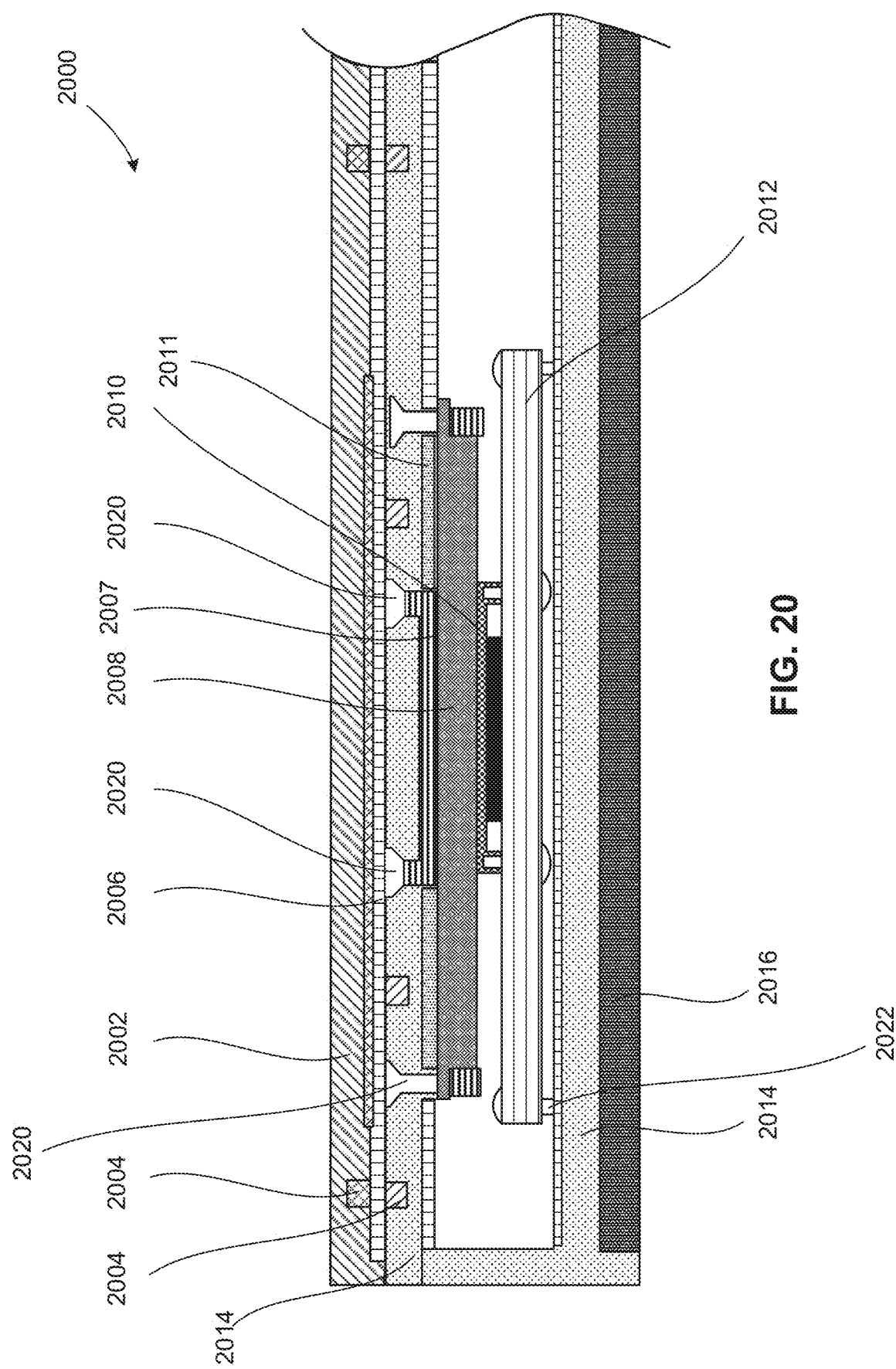
FIG. 20 is a cross-sectional view of an example chassis cooling construction that can be implemented in examples disclosed herein.

FIG. 20 is a cross-sectional view of an example chassis cooling construction 2000 that can be implemented in examples disclosed herein. The chassis cooling construction 2000 includes a cover (e.g., a leather cover, a leather-like cover, etc.) 2002, magnets 2004, a graphite layer 2006, a plate (e.g., a steel plate) 2007, a vapor chamber 2008, which is approximately 0.8 millimeters thick in this example, a die component (e.g., a silicon on chip (SoC) component) 2010, a gap filler (e.g., a liquid gap filler, a compressible gasket, etc.) 2011, a printed circuit board (PCB) 2012, which is approximately 0.72 millimeters thick in this example, a frame 2014, which is approximately 0.8 millimeters in thickness, for example, and a display (e.g., a foldable display, a foldable organic light-emitting diode (OLED) display, etc.) 2016 that is approximately 0.7 mm in this example.

In the illustrated example, tightening of screws 2020 draws the PCB 2012 and the vapor chamber 2008 toward the cover 2002, thereby enabling a highly conductive thermal pathway to the cover 1002 (e.g., heat spreading components of the cover 1002). In some such examples, the screws 2020 are tightened to compress the aforementioned liquid gap filler 2011. In some examples, the chassis cooling construction 2000 includes floating fasteners 2022 that enable the PCB 2012 to mitigate for part tolerances and/or variations that can lead to inadequate contact of the PCB 2012 and/or the die component 2010.

Figure 21:
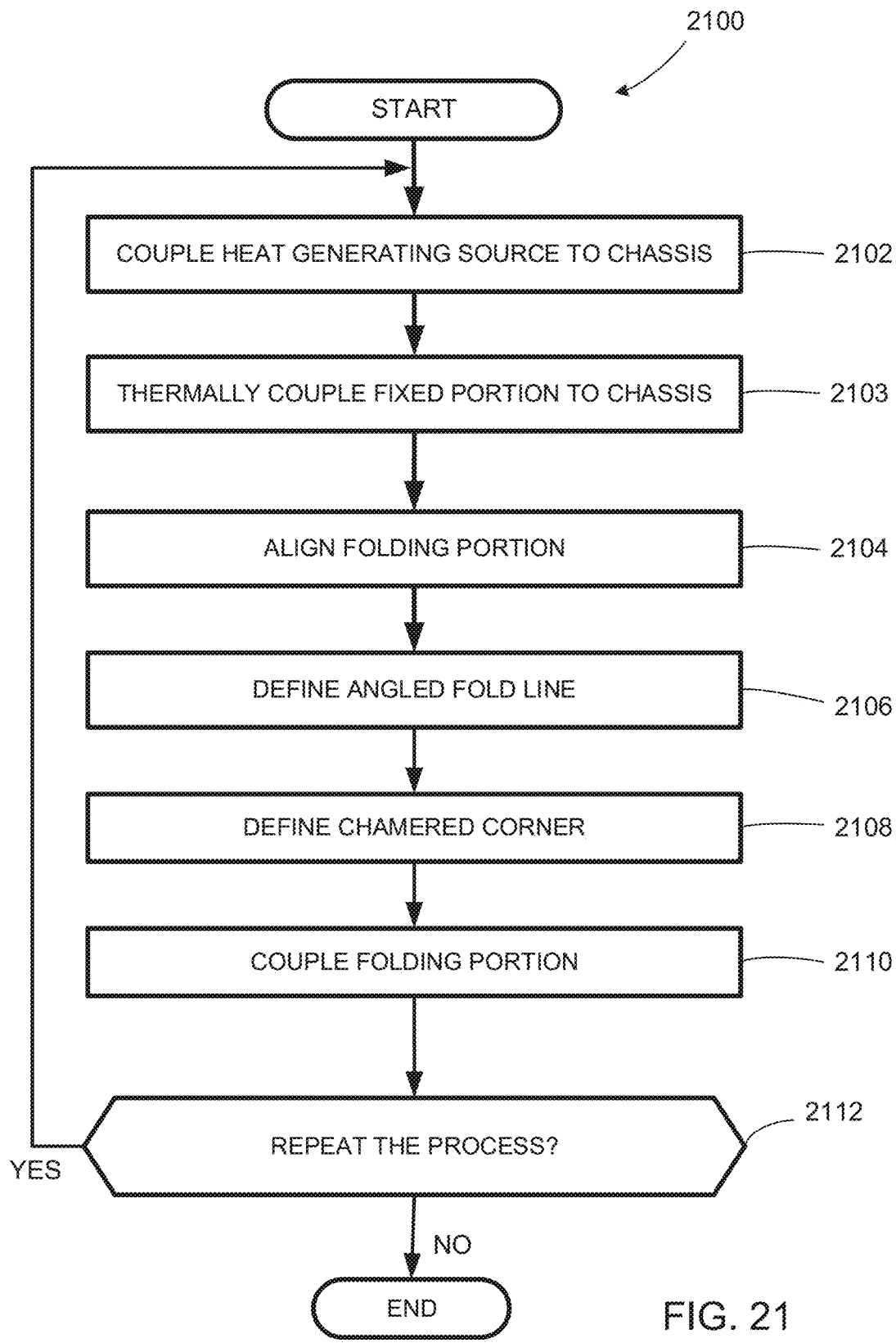
FIG. 21 is flowchart representative of an example method to produce examples disclosed herein.

FIG. 21 is flowchart representative of an example method 2100 to produce examples disclosed herein. The example method 2100 begins as a personal computing device (e.g., the personal computing device 100, the personal computing device 900) is being assembled and/or manufactured with a heat spreading cover that is at least partially permanently attached to the personal computing device.

At block 2102, a heat generating source, such as a circuit board (e.g., the PCB 2012), is coupled to a chassis (e.g., the chassis 1408). In the illustrated example, heat generating components are attached (directly or indirectly) to heat conducting components that define a thermal pathway to the cover of the personal computing device.

At block 2103, the fixed portion of the cover is thermally coupled to the chassis. Additionally or alternatively, the fixed portion is thermally coupled to heat generating sources of the personal computing device.

At block 2104, a folding portion (e.g., the folding portion 216, the folding portion 224, the folding portion 1006) of the cover is aligned to the corresponding fixed portion of the cover. In this example, the folding portion is removably coupled to the portion. In particular, the folding portion can be removable and/or swappable from the fixed portion. In other examples, the folding portion is permanently coupled to the fixed portion.

At block 2106, in some examples, an angled fold line (e.g., the fold line 702, the fold line 704) is defined between the fixed portion and the folding portion. In some examples, the angled fold line is angled relative to an edge and/or surface that sits on a tabletop or desktop surface. In some examples, multiple angled fold lines are implemented to provide a multitude of standing viewing angle options of the personal computing device.

At block 2108, in some examples, a chamfered corner is defined onto the folding portion. In some examples, multiple chamfered corners are defined onto the folding portion. In some such examples, the chamfered corner defines at least one additional standing angle of the personal computing device.

At block 2110, the folding portion of the illustrated example is coupled to the fixed portion. In this example, a hinge, fold line and/or hinge region is defined therebetween when the folding portion is coupled to the fixed portion. In some examples, folding portion and the fixed portion are integral.

At block 2112, it is determined whether to repeat the process. If the process is to be repeated (block 2112), control of the process returns to block 2102. Otherwise, the process ends.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Example 1 includes a protective cover to at least partially cover a personal computing device. The cover includes a fixed panel to be thermally coupled to a chassis of the personal computing device to define a heatsink of the personal computing device, and a foldable panel to be rotatably coupled to the fixed panel via a hinge to support the personal computing device to stand at an angle from a surface.

Example 2 includes the cover as defined in example 1, wherein the folding panel includes a first folding panel, and further including a second folding panel.

Example 3 includes the cover as defined in example 2, where the fixed panel, the first folding panel and the second folding panel define at least three quadrants of a rectangular grid of the cover.

Example 4 includes the cover as defined in example 3, further including a slide to accommodate a folding length variation associated with the folding panel.

Example 5 includes the cover as defined in example 2, where the second panel is hinged from the first folding panel.

Example 6 includes the cover as defined in example 5, where when the first and second folding panels are folded together, a stand with a triangular cross-sectional profile is defined.

Example 7 includes the cover as defined in example 6, further including an angled fold line disposed between the first and second folding panels.

Example 8 includes the cover as defined in example 6, further including a chamfered edge on at least one of the first or second folding panels.

Example 9 includes the cover as defined in example 2, where the first and second folding panels define first and second kickstands, respectively, the first and second kickstands operatively coupled to a sync axle.

Example 10 includes the cover as defined in example 2, further including a third folding panel to cover a display of the personal computing device.

Example 11 includes the cover as defined in example 10, where the hinge includes a first hinge, further including a second hinge positioned between the third folding panel and the fixed panel, and wherein the fixed panel at least partially defines the second hinge.

Example 12 includes the cover as defined in example 1, further including a compartment of the folding panel to receive and store a removable keyboard associated with the personal computing device.

Example 13 includes the cover as defined in example 1, where the folding panel includes a kickstand.

Example 14 includes the cover as defined in example 1, further including a graphite conductor extending from the fixed panel to the folding panel to thermally couple the chassis to the folding panel.

Example 15 includes the cover as defined in example 14, further including a plate disposed within the folding panel and thermally coupled to the graphite conductor.

Example 16 includes a personal computing device including a chassis and a protective cover. The protective cover includes a fixed panel thermally coupled to the chassis to define a heat sink of the personal computing device, and a folding panel to be rotatable coupled to the fixed panel via a hinge to support the personal computing device to stand at an angle from a surface.

Example 17 includes the personal computing device as defined in example 16, where the folding panel includes a first folding panel, and further including a second folding panel.

Example 18 includes the personal computing device as defined in example 17, where the fixed panel, the first folding panel and the second folding panel define at least three quadrants of a rectangular grid of the cover.

Example 19 includes the personal computing device as defined in example 18, further including a slide to accommodate a folding length variation associated with the folding panel.

Example 20 includes the personal computing device as defined in example 17, where the second folding panel is folded from the first folding panel.

Example 21 includes the personal computing device as defined in example 20, where the first and second folding panels are to be folded into a stand having a triangular cross-sectional profile that contacts the surface.

Example 22 includes the personal computing device as defined in example 21, further including an angled fold line disposed between the first and second folding panels.

Example 23 includes the personal computing device as defined in example 21, further including a chamfered edge on at least one of the first or second folding panels.

Example 24 includes the personal computing device as defined in example 17, where the first and second folding panels define first and second kickstands, respectively, the first and second kickstands operatively coupled to a sync axle.

Example 25 includes the personal computing device as defined in example 17, further including a third folding panel to cover a display of the personal computing device.

Example 26 includes the personal computing device as defined in example 25, where the hinge includes a first hinge, further including a second hinge positioned between the third folding panel and the fixed panel, and wherein the fixed panel at least partially defines the second hinge.

Example 27 includes the personal computing device as defined in example 16, further including a compartment of the folding panel to receive and store a removable keyboard associated with the personal computing device.

Example 28 includes the personal computing device as defined in example 16, where the folding panel includes a kickstand.

Example 29 includes the personal computing device as defined in example 16, further including a graphite conductor extending from the fixed panel to the folding panel to thermally couple the chassis to the folding panel.

Example 30 includes the personal computing device as defined in example 29, further including a plate disposed within the folding panel and thermally coupled to the graphite conductor.

Example 31 includes a method including coupling a heat generating source associated with a personal computing device to a chassis of the personal computing device, thermally coupling a fixed panel of a protective cover of the personal computing device to the chassis to define a heat sink of the personal computing device, and aligning a folding panel of the cover so that the folding panel can be deployed to support the personal computing device to stand at an angle from a surface.

Example 32 includes the method as defined in example 31, further including defining an angled fold line on the cover.

Example 33 includes the method as defined in example 32, further including defining a chamfered corner associated with the angled fold line on the folding panel.

From the foregoing, it will be appreciated that example methods, apparatus and articles of manufacture have been disclosed that enable stands with thermally efficient characteristics to be used for supporting and/or orienting personal computing devices on a surface. Examples disclosed herein enable increased flexibility and viewing ranges of the personal computing devices.

This patent claims priority to, and the benefit of, U.S. Provisional Patent Application Ser. No. 62/937,631, which was filed on Nov. 19, 2019. U.S. Provisional Patent Application Ser. No. 62/937,631 is hereby incorporated herein by reference in its entirety.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. Further, any aspects or features of examples disclosed herein can be combined with any others of the examples disclosed herein.

The following claims are hereby incorporated into this Detailed Description by this reference, with each claim standing on its own as a separate embodiment of the present disclosure.

What is claimed is:

1. A protective cover to at least partially cover a personal computing device, the cover comprising:
    a first panel to be thermally coupled and fixed to a chassis of the personal computing device, the first panel to define a heatsink of the personal computing device; and
    a second panel to be rotatably coupled to the first panel at a first fold line, to support the personal computing device to stand at an angle from a surface;
    a third panel rotatably coupled to the second panel at a second fold line, at least one of the second or third panels including a kickstand; and
    a fourth panel, the third panel rotatably coupled to the fourth panel at the first fold line, the first, second, third and fourth panels corresponding to four quadrants of an outer surface of the cover.

2. The cover as defined in claim 1, further including a locking hinge operatively coupled between the second panel and the first panel.

3. The cover as defined in claim 1, wherein when the second and third panels are folded together, a stand with a triangular cross-sectional profile is defined.

4. The cover as defined in claim 3, wherein the first fold line is an angled fold line.

5. The cover as defined in claim 3, further including a chamfered edge on at least one of the first or second panels.

6. The cover as defined in claim 1, wherein the second and third panels define first and second kickstands, respectively, the first and second kickstands operatively coupled to a sync axle.

7. The cover as defined in claim 1, further including a fifth panel to cover a display of the personal computing device, the fifth panel rotatably coupled to the third and fourth panels.

8. The cover as defined in claim 1, wherein at least one of the second or third panels defines a compartment to receive and store a removable keyboard associated with the personal computing device.

9. The cover as defined in claim 1, further including a graphite conductor extending from the first panel to the second panel to thermally couple the chassis to the second panel.

10. The cover as defined in claim 9, further including a plate within the second panel, the plate thermally coupled to the graphite conductor.

11. The cover as defined in claim 1, further including a heat pipe extending from the first panel to at least one of the second, third or fourth panels.

12. The cover as defined in claim 1, further including a heat pipe extending from the first panel to the fourth panel, the first and fourth panels fixed to the chassis.

13. The cover as defined in claim 1, wherein the fourth panel is rotatably coupled to the first panel at the second fold line.

14. A protective cover to at least partially cover a personal computing device, the cover comprising:
    a first panel to be thermally coupled and fixed to a chassis of the personal computing device, the first panel to define a heatsink of the personal computing device; and
    a second panel to be rotatably coupled to the first panel at a first fold line, to support the personal computing device to stand at an angle from a surface;
    a third panel rotatably coupled to the second panel at a second fold line;
    a fourth panel, the third panel rotatably coupled to the fourth panel at the first fold line, the first, second, third and fourth panels corresponding to four quadrants of an outer surface of the cover; and a slide to accommodate a folding length variation associated with folding of at least one of the second, third or fourth panels.

15. A personal computing device comprising:
a chassis; and
a protective cover including:
- a first panel thermally coupled and fixed to the chassis, the first panel to operate as a heat sink of the personal computing device,
- a second panel rotatably coupled to the first panel at a first fold line, the second panel to support the personal computing device to stand at an angle from a surface,
- a third panel rotatably coupled to the second panel at a second fold at least one of the second or third panels including a kickstand, and
- a fourth panel, the third panel rotatably coupled to the fourth panel at the first fold line, the first, second, third and fourth panels respectively corresponding to first, second, third and fourth quadrants of an outer surface of the cover.

16. The personal computing device as defined in claim 15, further including a slide to accommodate a folding length variation associated with at least one of the first or second panels.

17. The personal computing device as defined in claim 15, wherein the second and third panels are to be folded into a stand having a triangular cross-sectional profile that contacts the surface.

18. The personal computing device as defined in claim 17, wherein the second fold line is an angled fold line disposed between the second and third panels.

19. The personal computing device as defined in claim 17, further including a chamfered edge on at least one of the second or third panels.

20. The personal computing device as defined in claim 15, wherein the second and third panels define first and second kickstands, respectively, the first and second kickstands operatively coupled to a sync axle.

21. The personal computing device as defined in claim 15, further including a fifth panel to cover a display of the personal computing device, the fifth panel rotatably coupled to the third and fourth panels.

22. The personal computing device as defined in claim 15, wherein at least one of the second or third panels defines a compartment to receive and store a removable keyboard associated with the personal computing device.

23. The personal computing device as defined in claim 15, further including a graphite conductor extending from the first panel to the second panel to thermally couple the chassis to the second panel.

24. The personal computing device as defined in claim 23, further including a plate disposed within the second panel, the plate thermally coupled to the graphite conductor.

25. A method comprising:
coupling a heat generating source associated with a personal computing device to a chassis of the personal computing device;
thermally coupling a first panel of a protective cover of the personal computing device to the chassis to provide a heat sink of the personal computing device, the first panel fixed to the chassis; and
aligning the first panel, a second panel, a third panel and a fourth panel of the cover so that the second panel is deployed to support the personal computing device at an angle from a surface, the second panel rotatably coupled to the first panel at a first fold line, the third panel rotatably coupled to the second panel at a second fold line, at least one of the second or third panels including a kickstand, the third panel rotatably coupled to the fourth panel at the first fold line, the first, second, third and fourth panels corresponding to four quadrants of an outer surface of the cover.

26. The method as defined in claim 25, further including defining the first fold line as an angled fold line.

27. The method as defined in claim 26, further including defining a chamfered corner associated with the angled fold line on the second panel.

* * * * *